(12) United States Patent
Ichinose et al.

(10) Patent No.: US 7,598,171 B2
(45) Date of Patent: Oct. 6, 2009

(54) METHOD OF MANUFACTURING A SEMICONDUCTOR DEVICE

(75) Inventors: Kazuhito Ichinose, Chiyoda-ku (JP); Akie Yutani, Chiyoda-ku (JP)

(73) Assignee: Renesas Technology Corp., Tokyo (JP)

( * ) Notice: Subject to any disclaimer, the term of this patent is extended or adjusted under 35 U.S.C. 154(b) by 199 days.

(21) Appl. No.: 11/619,790

(22) Filed: Jan. 4, 2007

(65) Prior Publication Data

US 2007/0161218 A1   Jul. 12, 2007

(30) Foreign Application Priority Data

Jan. 11, 2006 (JP) ............................. 2006-003704
Nov. 15, 2006 (JP) ............................. 2006-309237

(51) Int. Cl.
*H01L 21/44* (2006.01)

(52) U.S. Cl. ................... 438/677; 438/672; 438/675; 438/637; 438/E21.165

(58) Field of Classification Search ......... 438/677–672, 438/637–638, 618–624
See application file for complete search history.

(56) References Cited

U.S. PATENT DOCUMENTS 6,008,124 A * 12/1999 Sekiguchi et al. ........... 438/653
6,022,805 A *  2/2000 Sumi .......................... 438/677
7,101,725 B2 *  9/2006 Wada et al. .................. 438/65
2005/0181607 A1 * 8/2005 Aoyama ..................... 438/675

FOREIGN PATENT DOCUMENTS

| JP | 2-256235 | 10/1990 |
|----|----------|---------|
| JP | 3-116727 | 5/1991 |
| JP | 2001-520463 | 10/2001 |
| JP | 2003-17422 | 1/2003 |
| JP | 2003-133284 | 5/2003 |
| JP | 2003-282530 | 10/2003 |
| JP | 2003-324108 | 11/2003 |
| WO | WO 99/20812 | 4/1999 |

\* cited by examiner

*Primary Examiner*—Dung A. Le
(74) *Attorney, Agent, or Firm*—Oblon, Spivak, McClelland, Maier & Neustadt, L.L.P.

(57) ABSTRACT

A method of manufacturing a semiconductor device according to the present invention includes the steps of introducing first impurities of a first conductivity type into a main surface of a semiconductor substrate 1 to form a first impurity region, introducing second impurities of a second conductivity type to form a second impurity region, forming a first nickel silicide film on the first impurity region and forming a second nickel silicide film on the second impurity region, removing an oxide film formed on each of the first and second nickel silicide films by using a mixed gas having an $NH_3$ gas and a gas containing a hydrogen element mixed therein, and forming a first conducting film on the first nickel silicide film and forming a second conducting film on the second nickel silicide film, with the oxide film removed.

11 Claims, 15 Drawing Sheets

METHOD OF MANUFACTURING A SEMICONDUCTOR DEVICE

BACKGROUND OF THE INVENTION

1. Field of the Invention

The present invention relates to a semiconductor device and a method of manufacturing the same.

2. Description of the Background Art

When there is manufactured a semiconductor device having a metal film formed on a main surface of a semiconductor substrate, a natural oxide film tends to be formed on a surface of the metal film. Accordingly, when a contact portion or the like is formed on the metal film having the natural oxide film formed thereon, the natural oxide film blocks conduction between the contact portion and the metal film, which inevitably exerts a substantial influence on a characteristic of the semiconductor device to be manufactured. Accordingly, there have conventionally been proposed various types of cleaning methods, processing devices and the like for removing the natural oxide film formed on the metal film and the main surface of the semiconductor substrate.

For example, Japanese Patent Laying-Open No. 02-256235 discloses a methodology of removing a natural oxide film formed on a metal film and on a main surface of a semiconductor substrate, by using a gas containing a halogen element and a basic gas. Furthermore, Japanese Patent Laying-Open No. 2003-133284 discloses a batch-type vacuum processing device provided with an upper chamber placed on an upper side and a lower chamber placed on an lower side, the upper chamber being used as a heating chamber, while the lower chamber being used as a processing chamber.

In the batch-type vacuum processing room, a hydrogen radical generated by a plasma generator is used in the processing chamber to remove the natural oxide film. Furthermore, Japanese Patent Laying-Open No. 2003-282530 discloses a dry cleaning device provided with a processing room for processing a wafer, a plasma unit activating with plasma a processing gas for processing the wafer, and a lamp heating the wafer disposed in the processing room, in which activated species of the processing gas activated by the plasma unit are supplied to the processing room to generate a by-product on the wafer, and the wafer is then heated with the lamp to remove the by-product. In the dry cleaning device, an activated mixed gas reacts with a natural oxide film formed on the wafer disposed in a reaction room, which results in a by-product, and the by-product is subjected to heat treatment for removal.

Japanese Patent Laying-Open No. 2003-324108 describes a method of manufacturing a semiconductor device, including a step of using a mixed gas of an argon gas and at least one type of fluorine-based gas selected from a group consisting of a nitrogen trifluoride gas, a hydrogen fluoride gas, a dicarbon hexafluoride gas, a carbon tetrafluoride gas, and a sulfur hexafluoride gas, to perform plasma etching to remove a natural oxide film formed on surfaces of a semiconductor substrate and a gate electrode and then to form a metal silicide film on a silicon oxide film and a gate electrode.

Japanese Patent Laying-Open Nos. 03-116727 and 2003-017422 also describe a method of removing a natural oxide film formed on a surface of a semiconductor substrate or the like by using a mixed gas as in the patent document described above. PCT National Publication No. 2001-520463 describes a device and method for processing and adjusting an etching chamber to scrub a thin, non-uniform etching residue on a wall and a component of the etching chamber.

Conventionally, there has not been recognized the phenomenon itself in which, for example, a natural oxide film formed on a top surface of a metal film formed on an impurity region of an NMOS and a natural oxide film formed on a top surface of a metal film formed on an impurity region of a PMOS have different growth rates, resulting in a difference between the formed natural oxide films. Accordingly, the above-described patent documents do not describe a methodology for removing a natural oxide film with a thickness that varies depending on its position.

For the method of removing the natural oxide film with a thickness that varies depending on its position, there may be contemplated, for example, a method of removing the natural oxide films by using a methodology of wet processing, an Ar sputter etching or the like and by setting a condition of a removal time period or the like to meet a requirement for the thicker natural oxide film.

When such a methodology is used, however, the semiconductor substrate and the metal film are overetched in a portion where the thinner natural oxide film is formed. Furthermore, if the processing time period is set to meet the requirement for the thinner natural oxide film, the thicker natural oxide film is not completely removed and remains.

SUMMARY OF THE INVENTION

The present invention is made in view of the problems described above. A first object of the present invention is to provide a method of manufacturing a semiconductor device, the method being capable of favorably removing a natural oxide film with a thickness that varies depending on its position, without overetching a semiconductor substrate and a metal film each located under the natural oxide film. A second object of the present invention is to provide a semiconductor device in which a metal film formed on a main surface of a semiconductor substrate or the like and having a natural oxide film removed therefrom has an approximately uniform thickness.

In one aspect, a method of manufacturing a semiconductor device according to the present invention includes the steps of: introducing first impurities of a first conductivity type into a main surface of a semiconductor substrate to form a first impurity region; introducing second impurities of a second conductivity type into the main surface of the semiconductor substrate to form a second impurity region, the second conductivity type being different from the first conductivity type; forming a first nickel silicide film on the first impurity region and forming a second nickel silicide film on the second impurity region; removing an oxide film formed on each of the first and second nickel silicide films by using any of a mixed gas having an $NF_3$ gas and a gas containing a hydrogen element mixed therein and a gas having an $NH_3$ gas and the gas containing the hydrogen element mixed therein; and forming a first conducting film on the first nickel silicide film and forming a second conducting film on the second nickel silicide film, with the oxide film removed.

In another aspect, a method of manufacturing a semiconductor device according to the present invention includes the steps of: introducing first impurities of a first conductivity type into a first semiconductor layer formed on a main surface of a semiconductor substrate to form a first gate electrode; introducing second impurities of a second conductivity type into a second semiconductor layer formed on the main surface of the semiconductor substrate to form a second gate electrode, the second conductivity type being different from the first conductivity type; forming a first nickel silicide film on the first gate electrode and forming a second nickel silicide film on the second gate electrode; using any of a mixed gas having an $NF_3$ gas and a gas containing a hydrogen element and a mixed gas having an $NH_3$ gas and the gas containing the hydrogen element mixed therein to remove an oxide film formed on each of the first and second nickel silicide films; and forming a first conducting film on the first nickel silicide film and forming a second conducting film on the second nickel silicide film, with the oxide film removed.

In one aspect, a semiconductor device according to the present invention includes: a first impurity region formed in a first portion of a main surface of a semiconductor substrate; a second impurity region formed in a second portion of the main surface of the semiconductor substrate; a first nickel silicide film formed on the first portion of the main surface of the semiconductor substrate, the first impurity region being located in the first portion; and a second nickel silicide film formed on the second portion of the main surface of the semiconductor substrate, the second impurity region being located in the second portion. A difference between a thickness of the first nickel silicide film and a thickness of the second nickel silicide film is set to be at most 10 nm.

In another aspect, a semiconductor device according to the present invention includes: a first gate electrode formed on a main surface of a semiconductor substrate and having first impurities of a first conductivity type introduced thereinto; a second gate electrode formed on the main surface of the semiconductor substrate and having second impurities of a second conductivity type introduced thereinto, the second conductivity type being different from the first conductivity type; a first nickel silicide film formed on the first gate electrode; a second nickel silicide film formed on the second gate electrode; a first conducting film formed on the first nickel silicide film; and a second conducting film formed on the second nickel silicide film. A difference between a thickness of the first nickel silicide film and a thickness of the second nickel silicide film is set to be at most 10 nm.

In another aspect, a method of manufacturing a semiconductor device according to the present invention includes the steps of: forming a semiconductor layer at a first portion of a main surface of a semiconductor substrate; and forming an impurity region by introducing impurities into a second portion of the main surface of the semiconductor substrate, the second portion being adjacent to the semiconductor layer, and forming a gate electrode by introducing the impurities into the semiconductor layer. The method of manufacturing the semiconductor device further includes the steps of: forming a first insulating film on each of both side surfaces of the gate electrode; forming a first nickel silicide film on the impurity region and forming a second nickel silicide film on the gate electrode; and forming a second insulating film covering the gate electrode and the impurity region. The method of manufacturing the semiconductor device further includes the step of etching the second insulating film to expose a region extending from an upper side of the first nickel silicide film to an upper side of the second nickel silicide film. The method of manufacturing the semiconductor device further includes the steps of: using any of a mixed gas having an $NF_3$ gas and a gas containing a hydrogen element mixed therein and a mixed gas having an $NH_3$ gas and the gas containing the hydrogen element to remove an oxide film formed on each of the first and second nickel silicide films; and forming a conducting film extending from the first nickel silicide film to the second nickel silicide film.

In another aspect, a method of manufacturing a semiconductor device according to the present invention includes the steps of: forming a first semiconductor layer and a second semiconductor layer at a first portion and a second portion, respectively, of a main surface of a semiconductor substrate; introducing first impurities of a first conductivity type into a third portion of the main surface of the semiconductor substrate to form a first impurity region, the third portion being adjacent to the first semiconductor layer; and introducing the first impurities into the first semiconductor layer to form a first gate electrode. The method of manufacturing the semiconductor device further includes the steps of: introducing second impurities of a second conductivity type into a fourth portion of the main surface of the semiconductor substrate to form a second impurity region, the fourth portion being adjacent to the second semiconductor layer, and the second conductivity type being different from the first conductivity type; and introducing the second impurities into the second semiconductor layer to form a second gate electrode. The method of manufacturing the semiconductor device further includes the steps of: forming a first insulating film on each of both side surfaces of the first gate electrode and forming a second insulating film on each of both side surfaces of the second gate electrode; and forming a first nickel silicide film on the first impurity region and forming a second nickel silicide film on the second impurity region. The method of manufacturing the semiconductor device further includes the steps of: forming a third nickel silicide film on the first gate electrode and forming a fourth nickel silicide film on the second gate electrode; forming a third insulating film covering the first and second gate electrodes and the first and second impurity regions; and etching the third insulating film to expose a region extending from an upper side of the first nickel silicide film to an upper side of the third nickel silicide film and expose a region extending from an upper side of the second nickel silicide film to an upper side of the fourth nickel silicide film. The method of manufacturing the semiconductor device further includes the step of using any of a mixed gas having an $NF_3$ gas and a gas containing a hydrogen element mixed therein and a mixed gas having an $NH_3$ gas and the gas containing the hydrogen element mixed therein to remove an oxide film formed at each of the first, second, third, and fourth nickel silicide films. The method of manufacturing the semiconductor device further includes the steps of: forming a first conducting film extending from the upper side of the first nickel silicide film to the upper side of the third nickel silicide film; and forming a second conducting film extending from the upper side of the second nickel silicide film to the upper side of the fourth nickel silicide film.

In another aspect, a semiconductor device according to the present invention includes: a gate electrode formed on a first portion of a main surface of a semiconductor substrate; an impurity region formed in a second portion of the main surface of the semiconductor substrate, the second portion being adjacent to the gate electrode; a first nickel silicide film formed on the impurity region; and a second nickel silicide film formed on the gate electrode. The semiconductor device further includes a conducting film extending from an upper side of the first nickel silicide film to an upper side of the second nickel silicide film. As to a thickness of the conducting film in a direction of a normal to a surface of the conducting film, a difference between the thickest portion and the thinnest portion of the conducting film is set to be at most 10 nm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
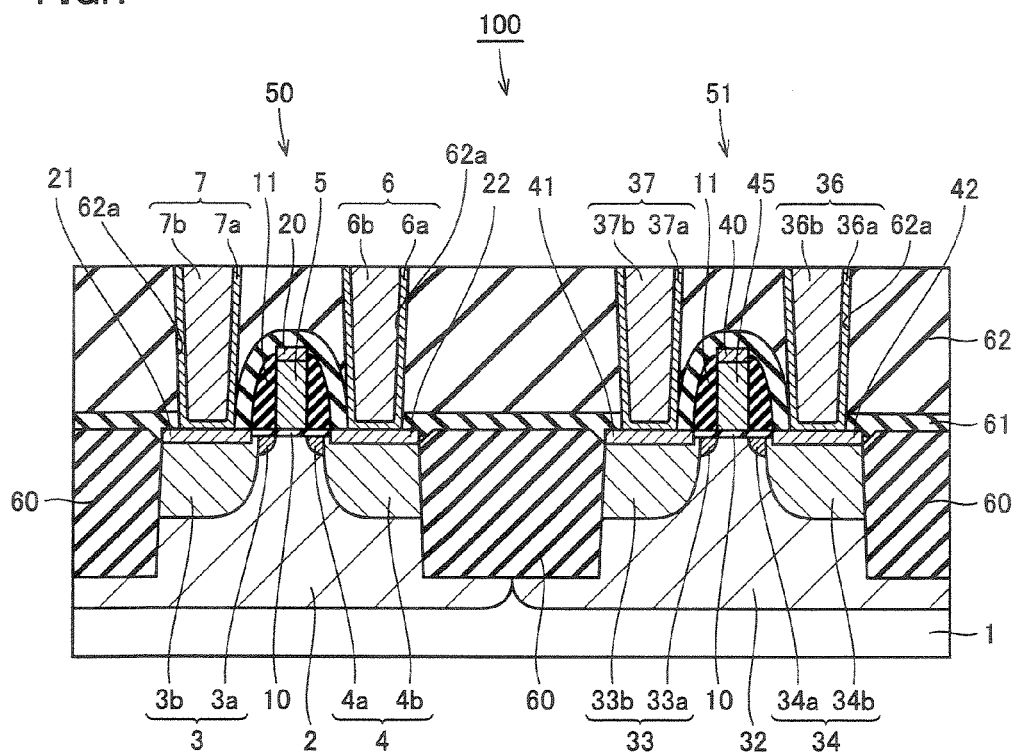
FIG. 1 is a cross section of a semiconductor device according to a first embodiment.

A semiconductor device and a method of manufacturing the same according to a first embodiment will hereinafter be described with reference to FIGS. 1 to 21. FIG. 1 is a cross section of a semiconductor device 100 according to the first embodiment. As shown in FIG. 1, semiconductor device 100 includes a semiconductor substrate 1, an isolated region 60 formed on a main surface of semiconductor substrate 1, an n-channel type Metal Oxide Semiconductor (MOS) transistor (hereinafter referred to as an nMOS transistor) 50 formed on the main surface of semiconductor substrate 1, and a p-channel type MOS transistor (hereinafter referred to as a pMOS transistor) 51 separated from nMOS transistor 50 by isolated region 60.

Semiconductor substrate 1 has a p-well region 2 and an n-well region 32 formed thereat, and nMOS transistor 50 is formed on a portion of the main surface of semiconductor substrate 1 where p-well region 2 is located, while pMOS transistor 51 is formed on a portion of the main surface of semiconductor substrate 1 where n-well region 32 is located. The nMOS transistor 50 is formed on the portion of the main surface of the semiconductor substrate where p-well region 2 is located, and includes an insulating film 10 made of an oxide silicon film or the like, a gate electrode 5 formed on insulating film 10, an n-type impurity region (first impurity region) 3 formed in a portion of the main surface of semiconductor substrate 1, the portion being adjacent to gate electrode 5, and an impurity region (first impurity region) 4 formed in a portion of the main surface of semiconductor substrate 1, the portion being located on a side opposite to impurity region 3 with respect to gate electrode 5.

On a top surface of gate electrode 5, there is formed a nickel silicide (NiSi) film (first nickel silicide film) 20, and on both side surfaces of gate electrode 5, there is formed a sidewall 11 made of a silicon oxide film or the like. Nickel silicide film 20 has any stoichiometrical composition such as $Ni_2Si$, $NiSi$, $NiSi_2$ or the like, and is preferably NiSi. Impurity regions 3 and 4 have impurity regions 3a and 4a extending to a region under sidewall 11, and impurity regions 3b and 4b each functioning as a source or a drain. Into impurity regions 3b and 4b, there are introduced n-type impurities of a concentration higher than that of impurities introduced into impurity regions 3a and 4a. On impurity regions 3 and 4, there are formed nickel silicide films (first nickel silicide films) 21 and 22. A film thickness of each of these nickel silicide films 20, 21 and 22 in a direction perpendicular to the main surface of semiconductor substrate 1 is set to be, for example, at least approximately 20 nm and at most approximately 25 nm.

On top surfaces of nickel silicide films 21 and 22, there are formed contact portions 7 and 6. Contact portions 7 and 6 include conducting films (first conducting films) 7a and 6a each formed along an inner wall surface of a contact hole 62a, and conducting films 7b and 6b formed on top surfaces of conducting films 7a and 6a. Conducting films 7a and 6a are brought into contact with impurity regions 3 and 4, and are formed of a structure of a single layer made of a Ti-based compound including Ti, TiN or the like, a Ta-based compound including Ta, TaN or the like, or a W-based compound including W, WN or the like, for example, a stacked-layer structure made by combining two types or three types of these single layer films, or the like. Conducting films 6b and 7b are formed of, for example, W, Al, Cu or the like.

The pMOS transistor 51 is also formed in a manner similar to that of nMOS transistor 50. The pMOS transistor 51 includes a gate electrode 45 formed on a portion of the main surface of semiconductor substrate 1 where n-well region 32 is located, with insulating film 10 interposed therebetween, and impurity regions (second impurity regions) 33 and 34 formed in portions of the main surface of semiconductor substrate 1, which portions are located on both sides of gate electrode 45.

Sidewall 11 is formed on both side surfaces of gate electrode 45, and a nickel silicide film (second nickel silicide film) 40 is formed on a top surface of gate electrode 45. A nickel silicide film (second nickel silicide film) 41 is formed on a top surface of impurity region 33, and a nickel silicide film (second nickel silicide film) 42 is also formed on a top surface of impurity region 34. A film thickness of each of these nickel silicide films 40, 41 and 42 in a direction perpendicular to the main surface of semiconductor substrate 1 is set to be, for example, at least approximately 20 nm and at most approximately 25 nm.

Impurity region 33 includes an impurity region 33a extending to an underside of sidewall 11 and having p-type impurities introduced thereinto, and an impurity region 33b where p-type impurities of a concentration higher than that of the impurities introduced into impurity region 33a are introduced. Furthermore, impurity region 34 also includes an impurity region 34a extending to an underside of sidewall 11 and having p-type impurities introduced thereinto, and an impurity region 34b where p-type impurities of a concentration higher than that of the impurities introduced into impurity region 34a are introduced.

On top surfaces of nickel silicide films 41 and 42, there are formed contact portions 37 and 36. Contact portions 37 and 36 include conducting films (second conducting films) 37a and 36a each formed along the inner wall surface of contact hole 62a, and conducting films 37b and 36b formed on top surfaces of conducting films 37a and 36a. Conducting films 37a and 36a are brought into contact with impurity regions 33 and 34, and are formed of a structure of a single layer made of a Ti-based compound including Ti, TiN or the like, a Ta-based compound including Ta, TaN or the like, or a W-based compound including W, WN or the like, for example, a stacked-layer structure made by combining two types or three types of these single layer films, or the like. Conducting films 36b and 37b are made of, for example, W, Al, Cu or the like.

Figure 2:
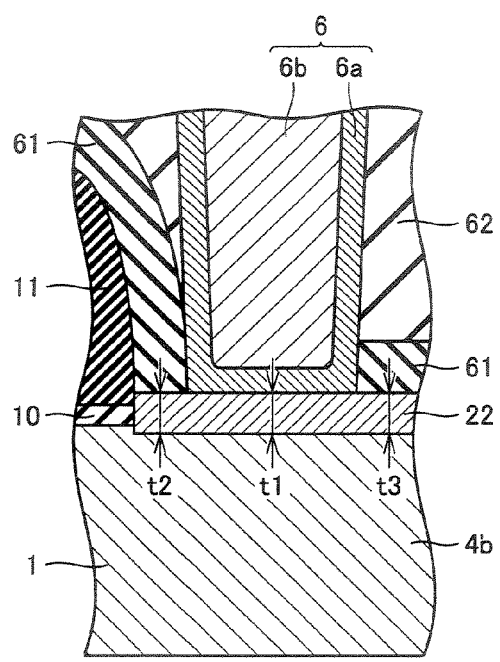
FIG. 2 is an enlarged cross section of a neighborhood of a contact portion.

FIG. 2 is an enlarged cross section of a neighborhood of contact portion 6. As shown in FIG. 2, a top surface of nickel silicide film 22 is made into an approximately flat surface. As to nickel silicide film 22, a portion under a contact section (first contact portion) with contact portion 6 is made thinnest. A difference between a thickness t1 of nickel silicide film 22 under the contact section with contact portion 6 in a direction perpendicular to the main surface of semiconductor substrate 1, and a thickness t2 or a thickness t3 of the nickel silicide film 22 on a periphery of the contact section with contact portion 6 in a direction perpendicular to the main surface of semiconductor substrate 1, is set to be at most 10 nm at a maximum, and set to be at most 5 nm on average.

In other words, nickel silicide film 22 is formed such that a contact section with contact portion 6 and a portion located on the periphery of this contact section are connected by a smooth flat surface, or that the contact section with contact portion 6 is made slightly concave to allow a part of contact portion 6 to be fitted thereinto.

Figure 3:
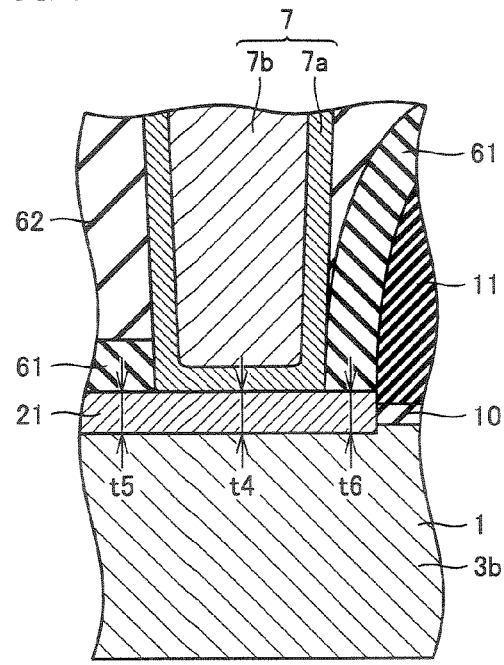
FIG. 3 is an enlarged cross section of a neighborhood of a contact portion.

FIG. 3 is an enlarged cross section of a neighborhood of contact portion 7. As shown in FIG. 3, a top surface of nickel silicide film 21 is made into an approximately flat surface, and this nickel silicide film 21 is also configured in a manner similar to that of nickel silicide film 22 shown in FIG. 2 above. In nickel silicide film 21, a difference between a thickness t4 of nickel silicide film 21 at a portion under a contact section with contact portion 7 in a direction perpendicular to the main surface of semiconductor substrate 1 and thickness t1 of nickel silicide film 22 shown in FIG. 2 is set to be at most 10 nm at a maximum, and set to be at most 5 nm on average. As such, nickel silicide films 22 and 21, each of which has a thickness of at least approximately 15 nm-20 nm, remain under contact portions 6 and 7, and hence nickel silicide films 21 and 22 can reduce resistance of impurity regions 3a and 4a, each of which functions as a source or a drain, and maintain a low leakage current.

Furthermore, the portions of nickel silicide films 21 and 22 located at the contact sections with contact portions 7 and 6 have uniform thicknesses with no wide variations, and there are suppressed variations in thickness of each of nickel silicide films 21 and 22. Even if a plurality of nMOS transistors 50 are formed, there are suppressed variations in thickness of nickel silicide films 21 and 22 formed on the top surfaces of impurity regions 3 and 4 of each of nMOS transistors 50. Accordingly, it is possible to suppress variations in electric resistance of impurity regions 3a and 4a, which function as the source and the drain of each of nMOS transistors 50, and suppress variations in characteristic of each of nMOS transistors 50. In addition, a low leakage current can be maintained.

In FIG. 1, nickel silicide films 41 and 42 are also formed on the top surfaces of impurity regions 33 and 34 in pMOS transistor 51. Nickel silicide films 41 and 42 are also formed in a manner similar to that of nickel silicide films 21 and 22, and each is formed into an approximately flat surface. A difference between thicknesses of nickel silicide films 21 and 22 under the contact sections (second contact portions) between nickel silicide films 21 and 22 and contact portions 7 and 6, and thicknesses of nickel silicide films 41 and 42 under the contact sections between nickel silicide films 41 and 42 and contact portions 37 and 36 is set to be at most 10 nm at a maximum, and set to be at most 5 nm on average.

As such, nickel silicide films 41 and 42 remain under contact portions 37 and 36, and hence nickel silicide films 41 and 42 can favorably reduce electric resistance of impurity regions 33a and 33b, each of which functions as a source or a drain. A difference in thickness between nickel silicide film 41 and nickel silicide film 42 is set to be at most 10 nm at a maximum, and set to be at most 5 nm on average. Furthermore, even if a plurality of pMOS transistors 51 are formed, there are suppressed variations in thickness of nickel silicide films 41 and 42 in each of pMOS transistors 51, and hence it is possible to suppress variations in electric resistance of impurity regions 33b and 34b, each of which functions as a source or a drain in each of pMOS transistors 51. In addition, a low leakage current can be maintained.

Figure 4:
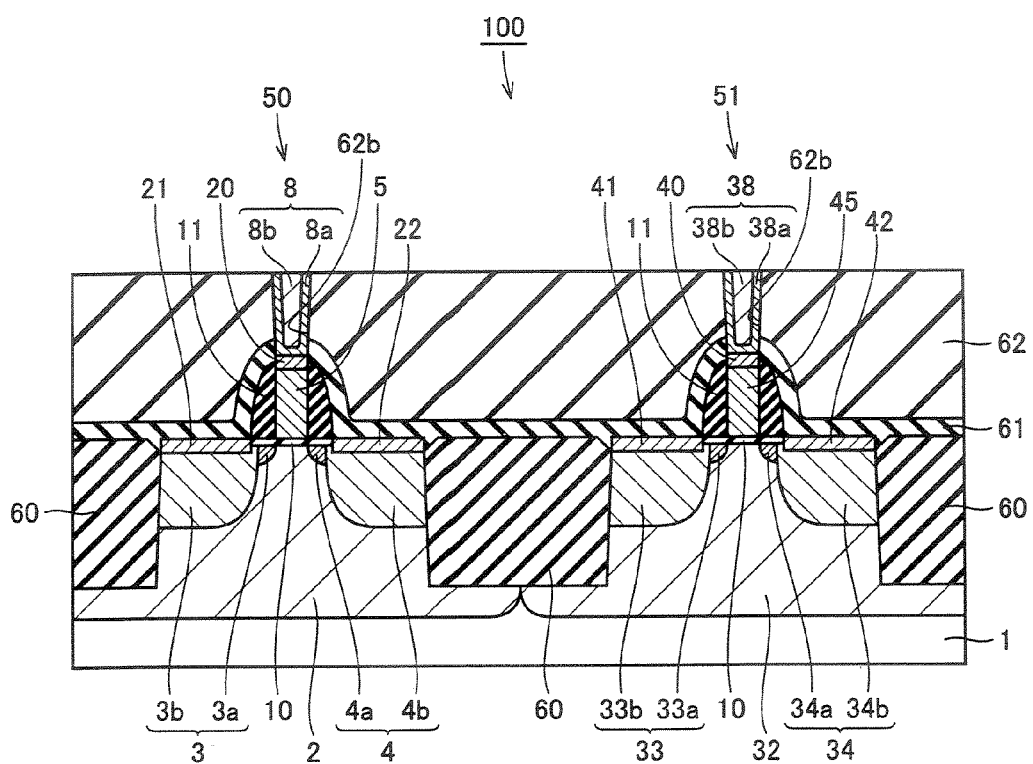
FIG. 4 is a cross section of the semiconductor device at a cross-sectional position different from that shown in FIG. 2.

FIG. 4 is a cross section of semiconductor device 100 at a cross-sectional position different from that shown in FIG. 2. As shown in FIG. 4, a contact portion 8 is formed at nickel silicide film 20, and a contact portion 38 is also formed on a top surface of nickel silicide film 40.

Figure 5:
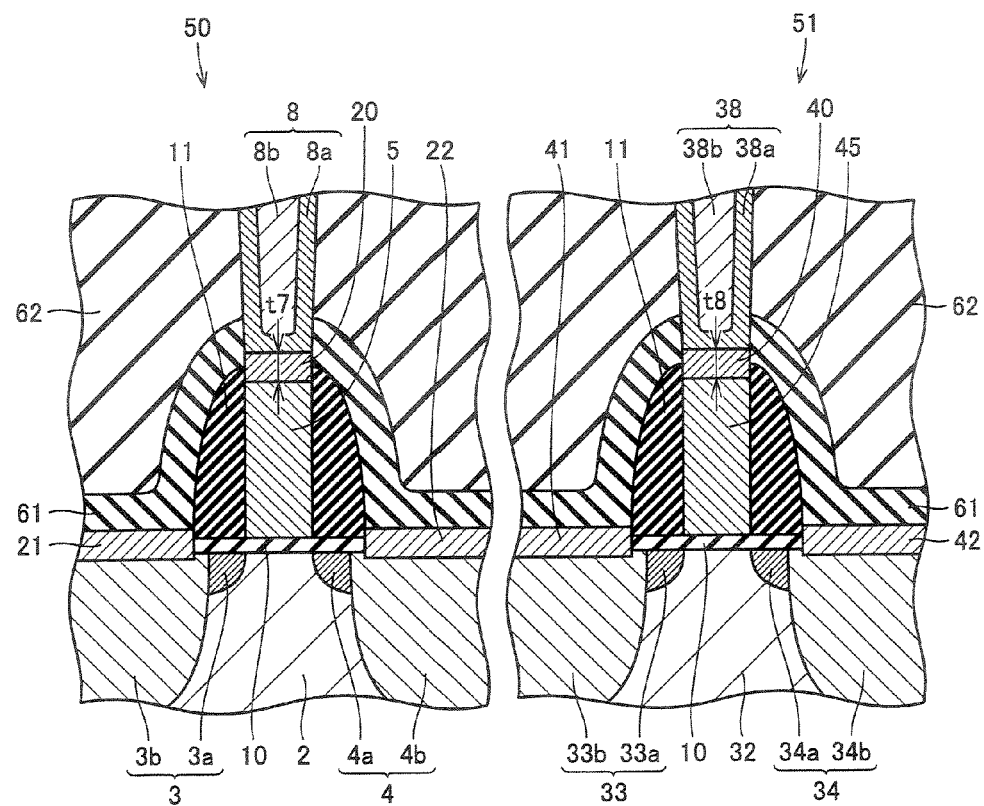
FIG. 5 is an enlarged cross section of an nMOS transistor and a pMOS transistor.

FIG. 5 is an enlarged cross section of nMOS transistor 50 and pMOS transistor 51. As shown in FIG. 5, approximately entire top surfaces of nickel silicide films 20 and 40 are made into contact sections with contact portions 8 and 38. Thicknesses t7 and t8 of such nickel silicide films 20 and 40 in a direction perpendicular to the main surface of semiconductor substrate 1 are set to be at least 20 nm and at most 25 nm. A difference between thickness t7 of nickel silicide film 20 in the direction perpendicular to the main surface of semiconductor substrate 1 and thickness t8 of nickel silicide film 40 in the direction perpendicular to the main surface of semiconductor substrate 1 is set to be at most 10 nm at a maximum, and set to be at most 5 nm on average.

Furthermore, even if a plurality of nMOS transistors 50 are formed, a difference in thickness t7 between any of two nickel silicide films 20 formed on the top surfaces of gate electrodes 5 is set to be at most 10 nm at a maximum, and set to be at most 5 nm on average. As such, there are suppressed variations in thickness t7 of nickel silicide films 20 formed on gate electrodes 5, and hence there are suppressed variations in characteristic of nMOS transistors 50. Furthermore, even if a plurality of pMOS transistors 51 are formed, there are also suppressed variations in characteristic of pMOS transistors 51.

In FIGS. 4 and 5, bottom portions of contact portions 8 and 38 are connected to the approximately entire surfaces of nickel silicide films 20 and 40. However, the configurations thereof are not limited thereto.

For example, contact portions 8 and 38 may be connected to a part of the top surfaces of nickel silicide films 20 and 40.

In this case, a difference between a thickness of nickel silicide film 20 under a contact section between nickel silicide film 20 and contact portion 8, and a thickness of nickel silicide film 20 on a periphery of the contact section with contact portion 8 is set to be at most 10 nm at a maximum, and at most 5 nm on average.

Figure 6:
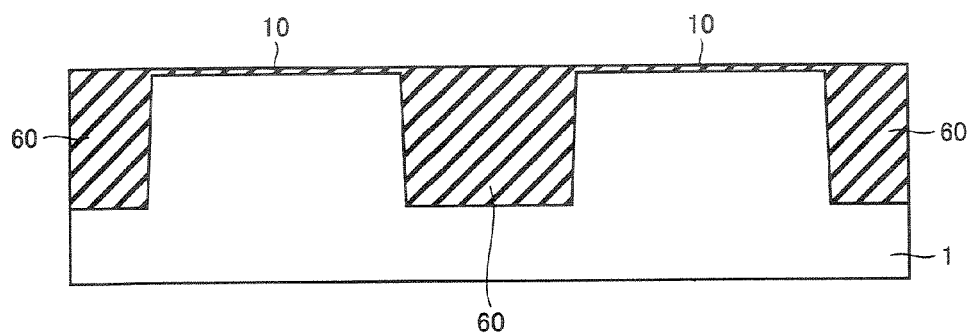
FIG. 6 is a cross section showing a first step of the steps of manufacturing the semiconductor device according to the first embodiment.
Figure 7:
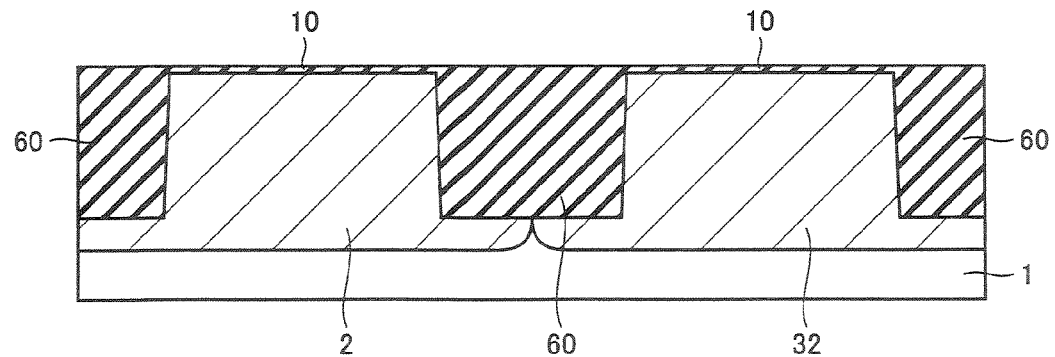
FIG. 7 is a cross section showing a second step of the steps of manufacturing the semiconductor device according to the first embodiment.

A method of manufacturing semiconductor device 100 according to the first embodiment will be described with reference to FIGS. 6 to 20. FIG. 6 is a cross section showing a first step of the steps of manufacturing semiconductor device 100 according to the first embodiment, and FIG. 7 is a cross section showing a second step thereof. As shown in FIG. 6, an isolated region 60 such as a trench isolation or an LOCOS isolation is formed on the main surface of semiconductor substrate 1. An upper side of the main surface of semiconductor substrate 1 is then thermally oxidized to form insulating film 10 made of a silicon oxide film or the like. As shown in FIG. 7, impurities are introduced into the main surface of semiconductor substrate 1 to form p-well region 2 and n-well region 32.

Figure 8:
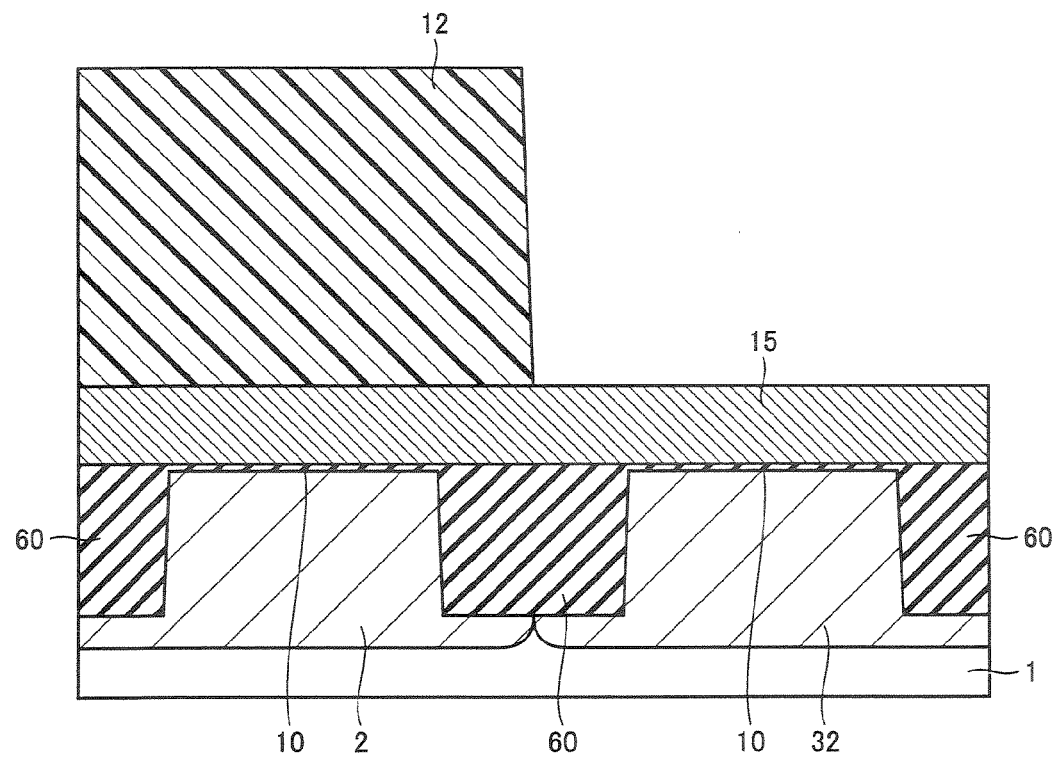
FIG. 8 is a cross section showing a third step of the steps of manufacturing the semiconductor device according to the first embodiment.
Figure 9:
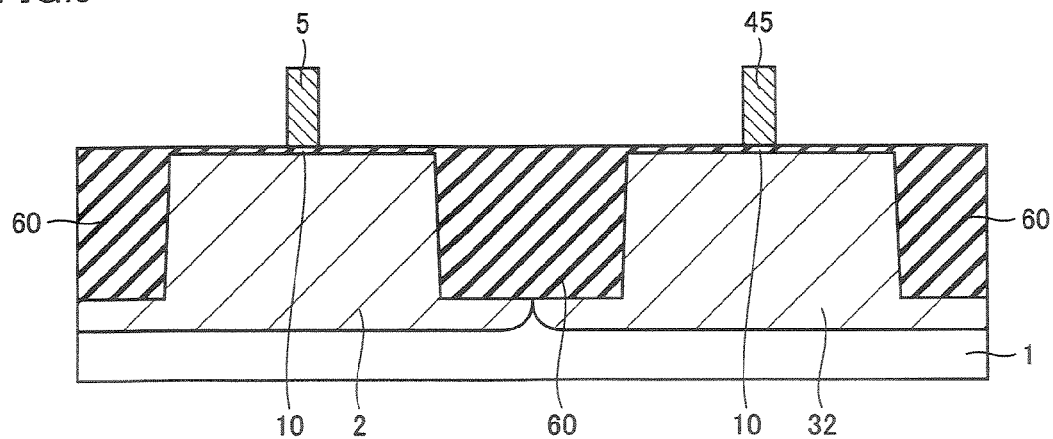
FIG. 9 is a cross section showing a fourth step of the steps of manufacturing the semiconductor device according to the first embodiment.

FIG. 8 is a cross section showing a third step of the steps of manufacturing semiconductor device 100, and FIG. 9 is a cross section showing a fourth step of the steps of manufacturing semiconductor device 100. As shown in FIG. 8, a semiconductor layer 15 formed of a polycrystalline silicon film or the like, for example, is formed on a top surface of insulating film 10. A portion of the main surface of semiconductor substrate 1 where well region 2 is located, is covered with a mask 12, while a portion of semiconductor layer 15 which portion is located above well region 32, has p-type impurities introduced thereinto.

Figure 10:
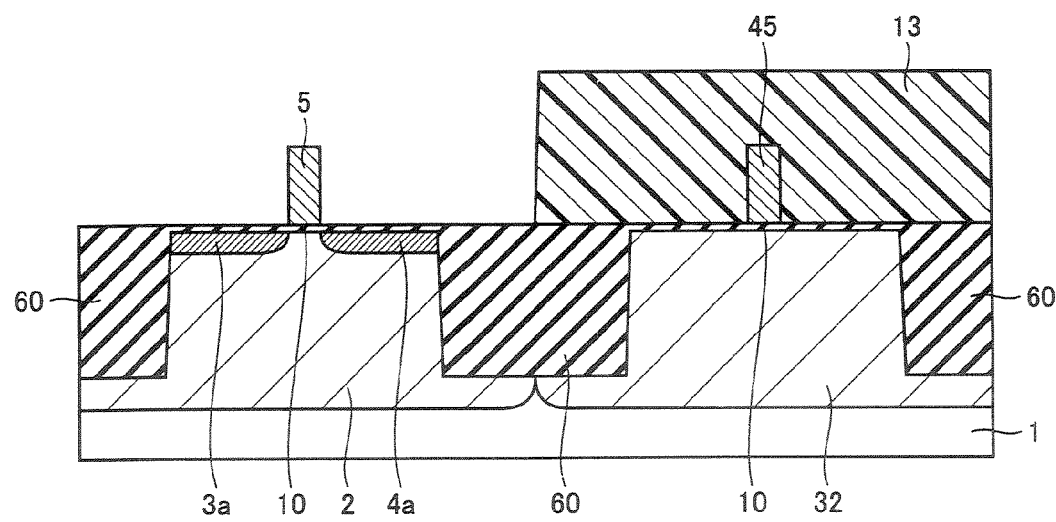
FIG. 10 is a cross section showing a fifth step of the steps of manufacturing the semiconductor device according to the first embodiment.
Figure 11:
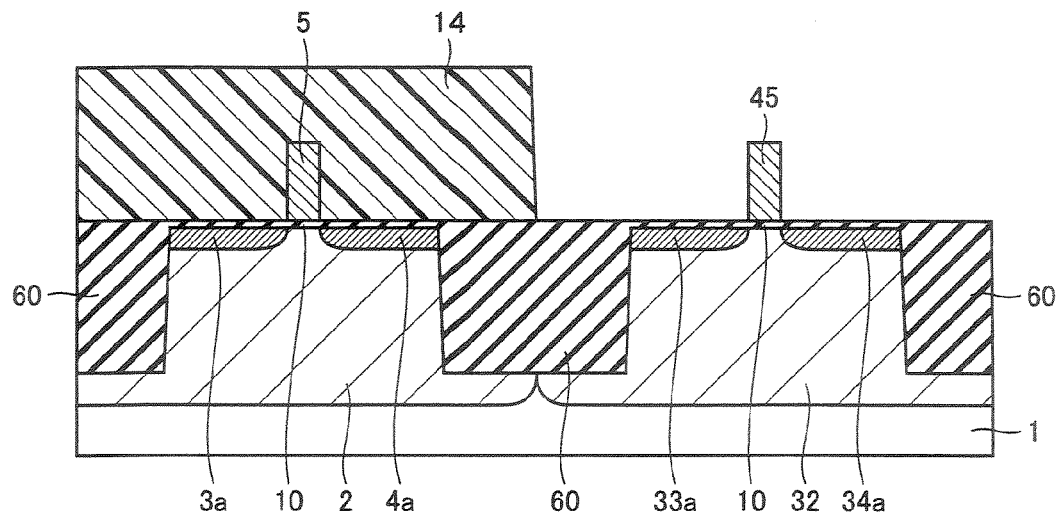
FIG. 11 is a cross section showing a sixth step of the steps of manufacturing the semiconductor device according to the first embodiment.

As shown in FIG. 9, semiconductor layer 15 is patterned to form gate electrode 5 above p-well region 2 and gate electrode 45 above n-well region 32. FIG. 10 is a cross section showing a fifth step of the steps of manufacturing semiconductor device 100, and FIG. 11 is a cross section showing a sixth step thereof. As shown in FIG. 10, there is exposed the portion of the main surface of semiconductor substrate 1 where p-well region 2 is located, and there is formed a mask 13 covering the portion of the main surface of semiconductor substrate 1 where n-well region 32 is located. N-type ions are then injected into the portion of the main surface of semiconductor substrate 1 where p-well region 2 is located, to form impurity regions 3a and 4a serving as n-type regions of an LDD on portions of the main surface of semiconductor substrate 1, which are located on both sides of gate electrode 5. At this time, n-type impurities are also introduced into gate electrode 5.

As shown in FIG. 11, there is formed a mask 14 covering the portion of the main surface of semiconductor substrate 1 where p-well region 2 is located, and exposing the portion of the main surface of semiconductor substrate 1 where n-well region 32 is located. P-type impurities are then introduced into the portion of the main surface of semiconductor substrate 1 where n-well region 32 is located, to form impurity regions 33a and 34a serving as p-type regions of an LDD on portions of the main surface of semiconductor substrate 1, which are located on both sides of gate electrode 45. At this time, p-type impurities are also introduced into gate electrode 45.

Figure 12:
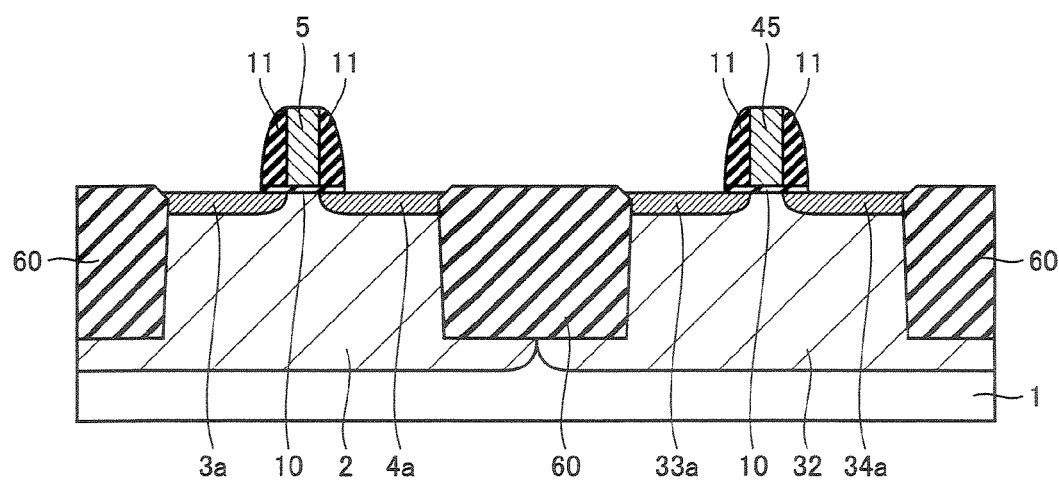
FIG. 12 is a cross section showing a seventh step of the steps of manufacturing the semiconductor device according to the first embodiment.
Figure 13:
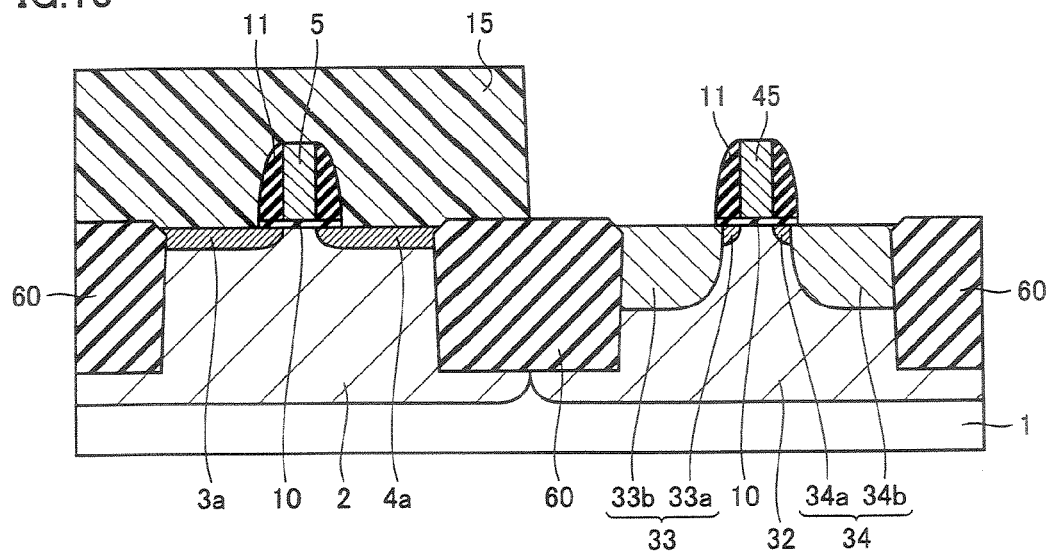
FIG. 13 is a cross section showing an eighth step of the steps of manufacturing the semiconductor device according to the first embodiment.

FIG. 12 is a cross section showing a seventh step of the steps of manufacturing semiconductor device 100, and FIG. 13 is a cross section showing an eighth step thereof. As shown in FIG. 12, an insulating film made of a silicon oxide film or the like is deposited on the main surface of semiconductor substrate 1, and the insulating film is then etched to form sidewall 11 on a side surface of each of gate electrodes 5 and 45. By doing so, insulating film 10 remains under each of gate electrodes 5, 45 and sidewall 11, while portions of the main surface of semiconductor substrate 1, which are located on impurity regions 3a, 4a, 33a and 44a, are exposed.

As shown in FIG. 13, there is formed a mask 15 covering the portion of the main surface of semiconductor substrate 1 where p-well region 2 is located, and exposing the portion of the main surface of semiconductor substrate 1 where n-well region 32 is located. Subsequently, p-type impurities of a concentration higher than that of the p-type impurities introduced when impurity regions 33a and 34a are formed, are introduced into the portions of the main surface of semiconductor substrate 1, which are located on the sides of sidewall 11, so as to form impurity regions 33b and 34b that function as a source region and a drain region of a p+type region.

As such, impurity regions 33 and 34 are formed on the portions of the main surface of semiconductor substrate 1, which are located on both sides of gate electrode 45. Similarly, n-type impurities of a concentration higher than that used when impurity regions 3a and 4a are formed, are introduced into the portion of the main surface of semiconductor substrate 1 where well region 2 is located, to form impurity regions 3b and 4b that function as a source region and a drain region of an n+type region. As such, impurity regions 3 and 4 are formed on the portions of the main surface of semiconductor substrate 1, which are located on both sides of gate electrode 5.

Figure 14:
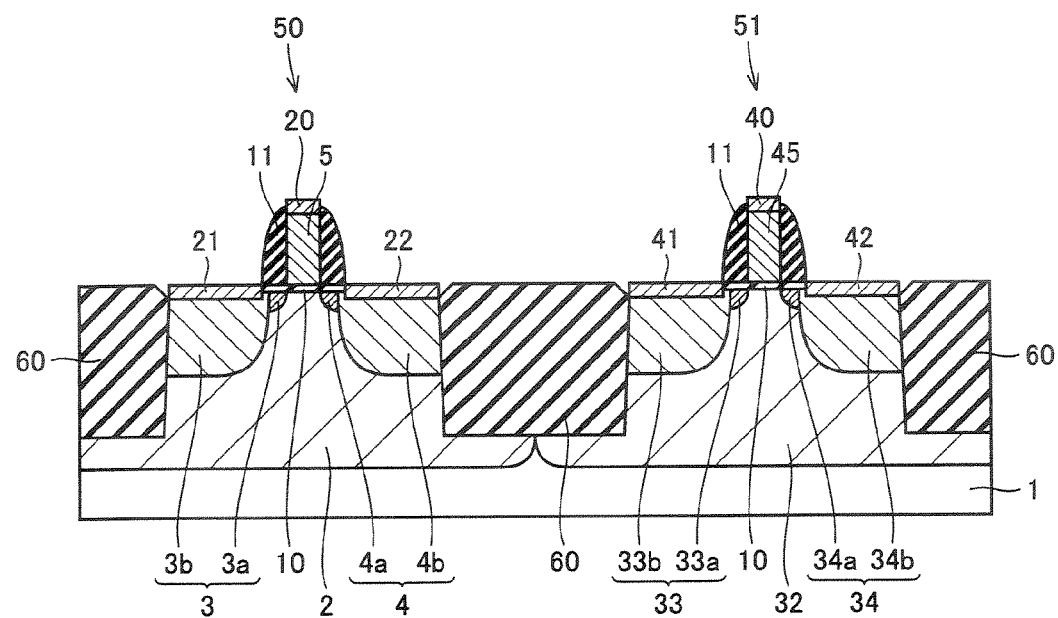
FIG. 14 is a cross section showing a ninth step of the steps of manufacturing the semiconductor device according to the first embodiment.
Figure 15:
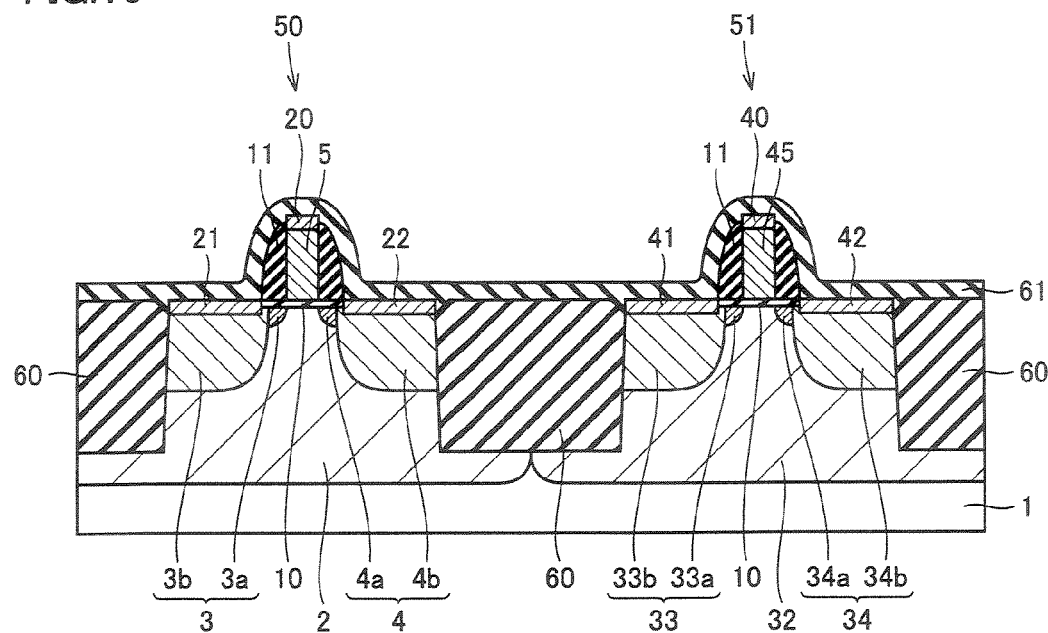
FIG. 15 is a cross section showing a tenth step of the steps of manufacturing the semiconductor device according to the first embodiment.

FIG. 14 is a cross section showing a ninth step of the steps of manufacturing semiconductor device 100, and FIG. 15 is a cross section showing a tenth step thereof. As shown in FIG. 14, nickel silicide films 21, 22, 41, 42, 20 and 40 are formed on top surfaces of impurity regions 3, 4, 33 and 34 and on top surfaces of gate electrodes 5 and 45. At this time, prior to forming nickel silicide films 21, 22, 41, 42, 20 and 40 on the main surface of semiconductor substrate 1 and on gate electrodes 5 and 45, there may be used any of a mixed gas of a nitrogen trifluoride ($NF_3$) gas and an $H_2$ gas, a mixed gas of the $NF_3$ gas and a hydrogen fluoride (HF) gas, a mixed gas of the $NF_3$ gas and an $NH_3$ gas, a mixed gas of the $NH_3$ gas and the $H_2$ gas, and a mixed gas of the $NH_3$ gas and the HF gas, to form in advance oxidation-resistant films made of SiH or the like on the portions of the main surface of semiconductor substrate 1 where impurity regions 3, 4, 33 and 34 are located, and on top surfaces of gate electrodes 5 and 45, and after the oxidation-resistant films are removed by heat treatment, nickel silicide films 21, 22, 41, 42, 20 and 40 may be formed.

As such, by forming in advance the oxidation-resistant film, it is possible to suppress formation of natural oxide films between the portions of the main surface of semiconductor substrate 1 where impurity regions 3, 4, 33 and 34 are located, and nickel silicide films 21, 22, 41 and 42. Furthermore, it is possible to suppress formation of natural oxide films between the top surfaces of gate electrodes 5 and 45, and nickel silicide films 20 and 40. Accordingly, it is possible to favorably reduce resistance of impurity regions 3, 4, 33 and 34, and also reduce resistance of gate electrodes 5 and 45. The step of forming such an oxidation-resistant film is suitable when a chamber for forming impurity regions 3, 4, 33 and 34 is different from a chamber for forming nickel silicide films 20, 21, 22, 40, 41 and 42. In other words, when the semiconductor substrate is transported from the chamber for forming the impurity regions to the chamber for forming the nickel silicide films, formation of a natural oxide film can favorably be suppressed.

As shown in FIG. 15, an insulating film 61 made of a silicon oxide film or the like is formed to cover semiconductor substrate 1, gate electrodes 5 and 45.

Figure 16:
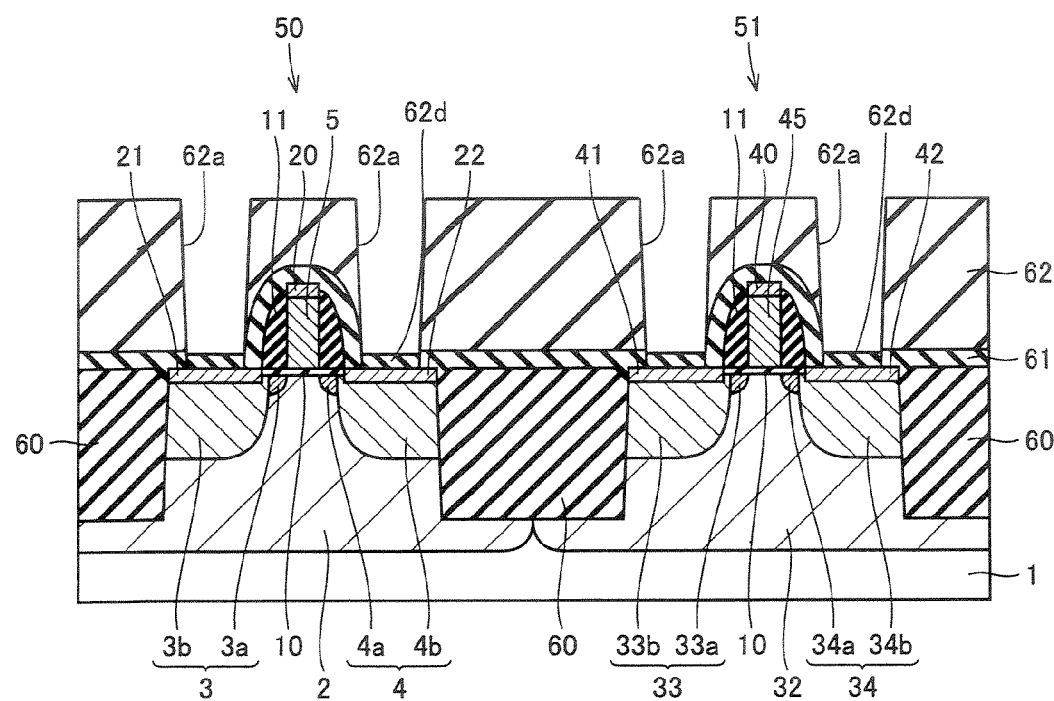
FIG. 16 is a cross section showing an eleventh step of the steps of manufacturing the semiconductor device according to the first embodiment.
Figure 17:
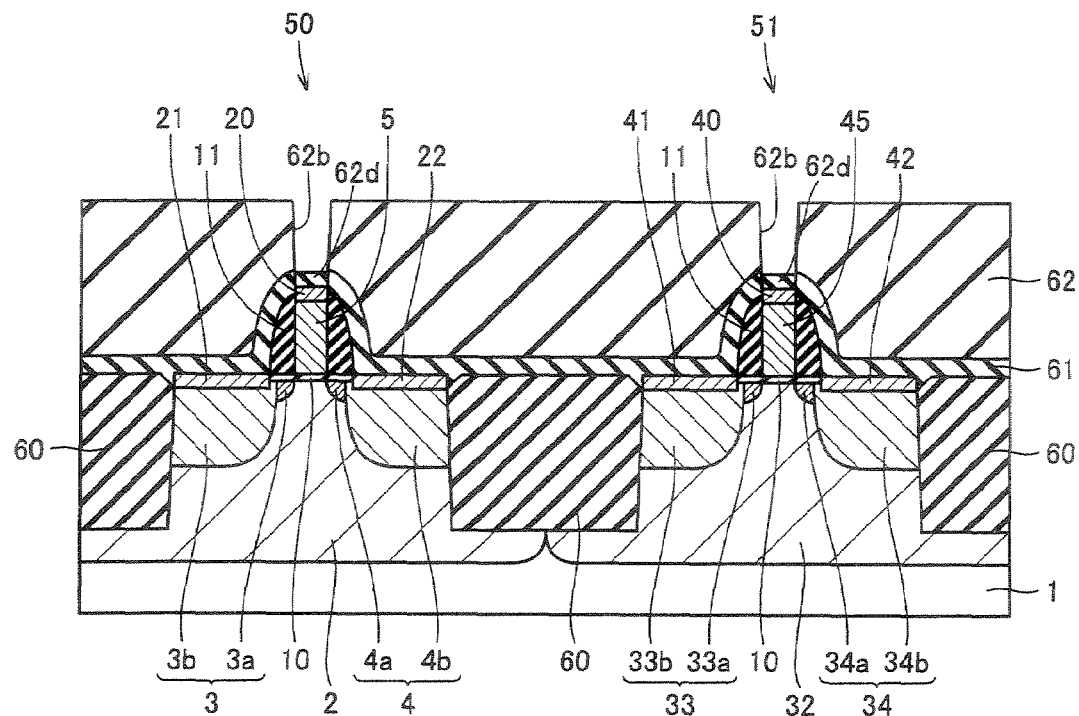
FIG. 17 is a cross section at a position different from that in FIG. 16.

FIG. 16 is a cross section showing an eleventh step of the steps of manufacturing semiconductor device, and FIG. 17 is a cross section at a position different from that of FIG. 16. As shown in FIGS. 16 and 17, an insulating film 62 made of an oxide silicon film or the like is formed on a top surface of insulating film 61. There are formed contact holes 62a and 62b extending to the top surfaces of nickel silicide films 21, 22, 41, 42, 20 and 40. In order that the contact portions to be formed are reliably brought into contact with nickel silicide films 21, 22, 41, 42, 20 and 40, bottom portions of contact holes 62a and 62b may protrude into the top surfaces of nickel silicide films 21, 22, 41, 42, 20 and 40, by, for example, at least approximately 5 nm and at most approximately 10 nm.

Figure 20:
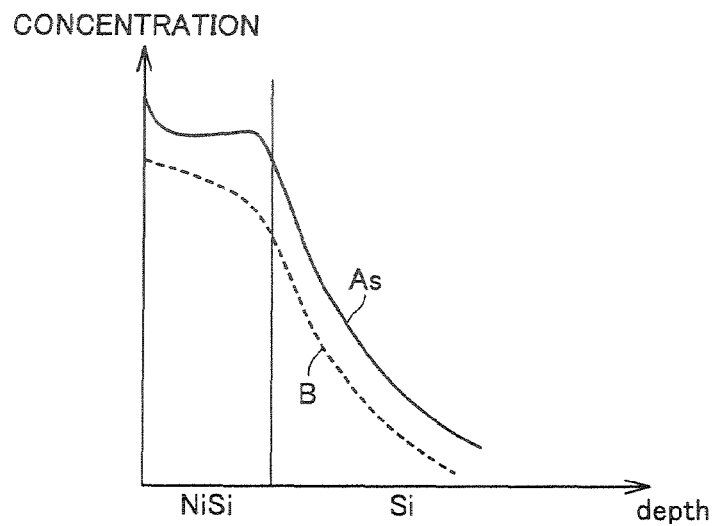
FIG. 20 is a graph showing a distribution of oxygen elements permeating into a semiconductor substrate.

As such, after contact holes 62a and 62b are formed, semiconductor substrate 1 is transported to a chamber for forming conducting films 6a, 7a, 8a, 36a, 37a and 38a shown in FIG. 1. During the transportation, natural oxide films may be formed on the top surfaces of nickel silicide films 21, 22, 41, 42, 20 and 40 at the bottom portions of contact holes 62a and 62b. FIG. 20 is a graph about semiconductor substrate 1 having nickel silicide films 20, 21, 22, 40, 41 and 42 formed thereat. In FIG. 20, the horizontal axis represents a depth from the surfaces of nickel silicide films 20, 21, 22, 40, 41 and 42, while the vertical axis represents a concentration of permeating oxygen elements.

In the graph in FIG. 20, a dashed line represents a distribution of the concentrations of permeating oxygen in the case where B is introduced into semiconductor substrate 1 and a nickel silicide film is formed on the main surface thereof, while a solid line represents a distribution of the concentrations of permeating oxygen in the case where As is introduced into semiconductor substrate 1 and a nickel silicide film is formed on the main surface thereof. In FIG. 20, the concentrations of B and As introduced into semiconductor substrate 1 are approximately the same. As seen from the graph shown in FIG. 20, the concentration of oxygen elements permeating into the nickel silicide films is higher in the case where As is introduced into semiconductor substrate 1 than in the case where B is introduced into semiconductor substrate 1. In other words, it is understood that a growth rate of a natural oxide film, which is formed on the top surface of the nickel silicide film formed on the main surface of semiconductor substrate 1, varies depending on a conductivity type of the impurities introduced into semiconductor substrate 1.

As such, it is understood that the natural oxide film is more likely to grow at the surface of the nickel silicide film formed on the portion of the main surface of semiconductor substrate 1 where n-type impurities are introduced, than at the surface of the nickel silicide film formed on the portion of the main surface of semiconductor substrate 1 where p-type impurities are introduced. Such a phenomenon does not exclusively occur on the main surface of semiconductor substrate 1, and a similar phenomenon occurs at the nickel silicide film formed on the gate electrode.

Accordingly, when semiconductor substrate 1 is transported to another chamber after contact holes 62a and 62b are formed, the natural oxide films formed on nickel silicide films 21 and 22 formed on the top surfaces of impurity regions 3 and 4 having n-type impurities introduced thereinto, have larger thicknesses than the natural oxide films formed on nickel silicide films 41 and 42 formed on impurity regions 33 and 34.

Similarly, the natural oxide film formed on the top surface of nickel silicide film 20 formed on gate electrode 5 having n-type impurities introduced thereinto, has a larger thickness than the natural oxide film formed on the top surface of nickel silicide film 40 formed on gate electrode 45 having p-type impurities introduced thereinto.

In other words, when semiconductor substrate 1 is transported to the chamber for forming conducting films 6a, 7a, 8a, 36a, 37a and 38a after contact holes 62a and 62b are formed, natural oxide films with thicknesses that vary depending on their positions are formed above the main surface of semiconductor substrate 1.

To the chamber for forming conducting films 6a, 7a, 8a, 36a, 37a and 38a, there is supplied any of a mixed gas of an $NF_3$ gas and an $NH_3$ gas, a mixed gas of the $NF_3$ gas and an HF gas, a mixed gas of the $NF_3$ gas and an $H_2$ gas, a mixed gas of the $NH_3$ gas and the $H_2$ gas, and a mixed gas of the $NH_3$ gas and the HF gas. In other words, for the mixed gas to be supplied, there is used any of a mixed gas of the $NF_3$ gas and a gas containing a hydrogen element, and a mixed gas including the $NH_3$ gas and the gas containing the hydrogen element. The natural oxide film is generally formed of a silicon oxide film, and when the natural oxide film reacts with any of the mixed gas of the $NF_3$ gas and the $NH_3$ gas, the mixed gas of the $NF_3$ gas and the HF gas, the mixed gas of the $NF_3$ gas and the $H_2$ gas, the mixed gas of the $NH_3$ gas and the $H_2$ gas, and the mixed gas of the $NH_3$ gas and the HF gas, it turns into $NH_4F$ or $(NH_4)_2SiF_6$, and $H_2O$.

Accordingly, a thin film (protective film) 62d made of $NH_4F$ or $(NH_4)_2SiF_5$ is formed on each of the surfaces of the portions, where the natural oxide films are formed, of nickel silicide films 21, 22, 41 and 42 located at the bottom portions of contact holes 62a. Furthermore, as shown in FIG. 17, thin film 62d is also formed on a portion of each of the surfaces of nickel silicide films 20 and 40 located at the bottom portions of contact hole 62b. Thin film 62d is then annealed at a temperature of at least 100° C. and at most 300° C. to remove the same, so that the surfaces of nickel silicide films 20, 21, 22, 40, 41 and 42 are exposed. As such, it is possible to remove a natural oxide film, a residue of interlayer insulating film 62 and the like, from the portions of the surfaces of nickel silicide films 21, 22, 41, 42, 20 and 40, which portions are located at the bottom portions of contact holes 62a and 62b.

The formed natural oxide films have thicknesses that vary depending on their positions, and hence the condition of a processing time period, a temperature of an atmosphere and the like is set to meet the requirement for the thickest films. Accordingly, removal of the natural oxide films formed on nickel silicide films 40, 41 and 42 is initially completed. Subsequently, removal of the natural oxide films formed on nickel silicide films 20, 21 and 22 is completed. At this time, the top surfaces of nickel silicide films 40, 41 and 42 are inevitably kept in contact with the mixed gas until the removal of the natural oxide films formed on the top surfaces of nickel silicide films 20, 21 and 22 is completed. However, there is no adverse effect such as overetching, on nickel silicide films 40, 41 and 42.

Accordingly, it is possible to favorably remove the natural oxide film formed on the main surface of semiconductor substrate 1 without causing an adverse effect such as an etching damage, on the surfaces of nickel silicide films 40, 41 and 42 located under the thinly-formed natural oxide films. Furthermore, by using the above-described mixed gas to remove the natural oxide film, it is possible to suppress an adverse effect such as etching of nickel silicide films 20, 21, 22, 40, 41 and 42. It is thereby possible to provide each of nickel silicide films 20, 21, 22, 40, 41 and 42 with a uniform thickness. In particular, contact hole 62b is formed at the approximately entire top surface of each of nickel silicide films 20 and 40, and hence if the natural oxide film is removed by wet etching or sputtering, nickel silicide films 20 and 40 may hardly remain or may be removed completely. With the above-described method, however, it is possible to allow the nickel silicide films 20 and 40 to remain in a favorable manner, without being scraped off.

By performing the step of removing the natural oxide film in a plasma atmosphere, the natural oxide film can be removed at a temperature as low as approximately 100° C. Furthermore, by removing the natural oxide film in the plasma atmosphere, the removal rate can be increased, and removal of the natural oxide film can be completed for a short period of time.

Figure 18:
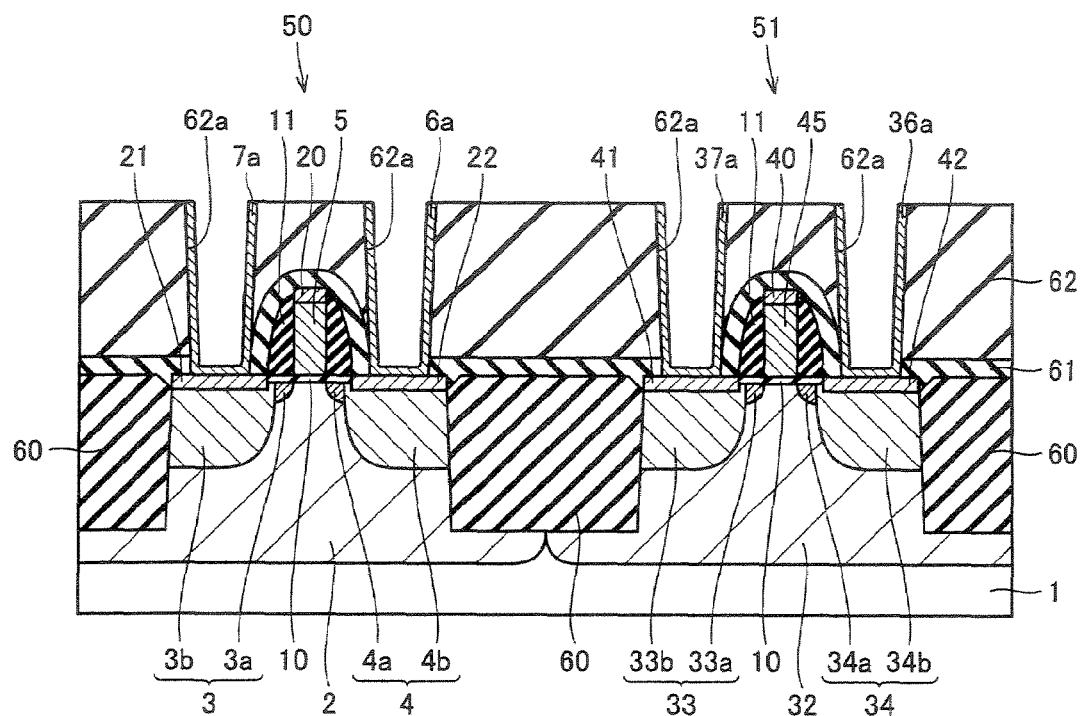
FIG. 18 is a cross section showing a twelfth step of the steps of manufacturing the semiconductor device according to the first embodiment.
Figure 19:
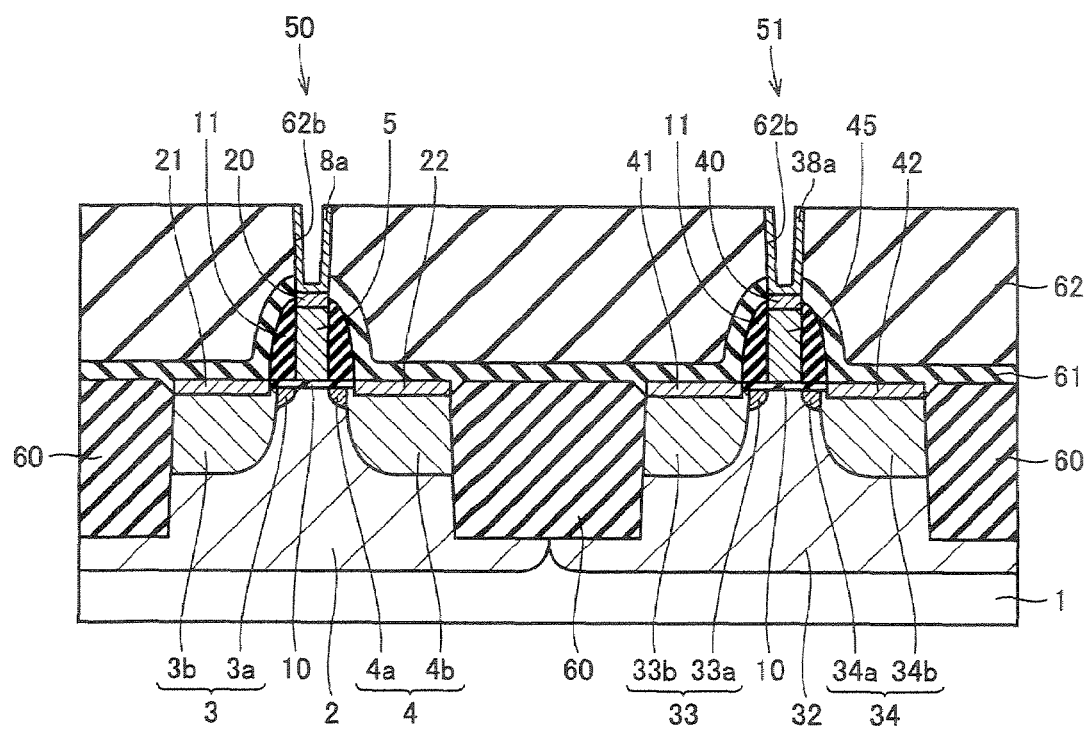
FIG. 19 is a cross section at a position different from that in FIG. 18.

FIG. 18 is a cross section showing a twelfth step of the steps of manufacturing semiconductor device 100, and FIG. 19 is a cross section at a cross-sectional position different from that in FIG. 18. As shown in FIG. 18, conducting films 6a, 7a, 8a, 36a, 37a and 38a such as barrier metals are formed on the surfaces of nickel silicide films 22, 21, 42, 41, 20 and 40, from which the natural oxide films and thin films 62d are removed. Conducting films 6a, 7a, 8a, 36a, 37a and 38a are formed by deposition at a temperature of at most 550° C. with a Physical Vapor Deposition (PVD) method or a Chemical Vapor Deposition (CVD) method, such that they are made into a structure of a single layer made of a Ti-based compound including Ti, TiN or the like, a Ta-based compound including Ta, TaN or the like, a W-based compound including W, WN or the like, for example, or a stacked-layer structure made by combining two types or three types of these single layer films. Note that if the conducting films are formed at a temperature higher than 550° C., an allowable temperature limit of the nickel silicide films is exceeded, so that the temperature is set to be at most 550° C.

The twelfth step is performed in the same chamber as the above-described eleventh step. In other words, the step of removing the natural oxide films and thin films 62d formed on the surfaces of nickel silicide films 20, 21, 22, 40, 41 and 42 to expose the surfaces of nickel silicide films 20, 21, 22, 40, 41 and 42, and the step of forming conducting films 6a, 7a, 8a, 36a, 37a and 38a on the surfaces of nickel silicide films 22, 21, 42, 41, 20 and 40, from which the natural oxide films are removed, are performed in the same chamber. Accordingly, conducting films 6a, 7a, 8a, 36a, 37a and 38a can be formed without the natural oxide films being formed again on the exposed surfaces of nickel silicide films 22, 21, 42, 41, 20 and 40.

As such, conducting films 6a, 7a, 8a, 36a, 37a and 38a can favorably be connected to nickel silicide films 22, 21, 42, 41, 20 and 40, and hence it is possible to apply a desired voltage to each of impurity regions 3, 4, 33 and 34, and gate electrodes 5 and 45, and suppress malfunction.

The process step is not limited to the above-described case where the step of removing the natural oxide films formed on the surfaces of nickel silicide films 22, 21, 42, 41, 20 and 40, and the step of forming conducting films 6a, 7a, 8a, 36a, 37a and 38a are performed in the same chamber. For example, the chamber for removing the natural oxide films and the chamber for forming conducting films 6a, 7a, 8a, 36a, 37a and 38a may be different. In this case, when the semiconductor substrate 1 is to be transported to the chamber for forming conducting films 6a, 7a, 8a, 36a, 37a and 38a after the removal of the natural oxide films, it is transported in an atmosphere in an approximately vacuum state to suppress formation of the natural oxide film.

As such, by transporting semiconductor substrate 1 in an atmosphere having its oxygen concentration lowered sufficiently enough to suppress formation of the natural oxide film, it is possible to prevent natural oxide films from being formed again on the portions of the top surfaces of nickel silicide films 21, 22, 41, 42, 20 and 40, which portions are located at the bottom portions of contact holes 62a and 62b. Furthermore, if the chamber for removing the natural oxide film is different from the chamber for forming conducting films 6a, 7a, 8a, 36a, 37a and 38a, semiconductor substrate 1 may be transported by allowing thin film 62d to remain on each of the top surfaces of nickel silicide films 20, 21, 22, 40, 41 and 42, in the step of removing the natural oxide film. As such, by allowing thin film 62d to remain on each of the top surfaces of nickel silicide films 20, 21, 22, 40, 41 and 42, it is possible to suppress formation of the natural oxide film on the portion of each of the surfaces of nickel silicide films 21, 22, 41, 42, 20 and 40, which portion is located at the bottom portion of each of contact holes 62a and 62b, during the transportation of semiconductor substrate 1. Thin film 62b is then annealed at a temperature of at least 100° C. and at most 300° C. in the chamber for forming conducting films 6a, 7a, 8a, 36a, 37a and 38a, to remove the same, and conducting films 6a, 7a, 8a, 36a, 37a and 38a are then formed.

As such, conducting films 6a, 7a, 8a, 36a, 37a and 38a are formed on the surfaces of nickel silicide films 22, 21, 42, 41, 20 and 40, from which the natural oxide films are removed, and hence nickel silicide films 22, 21, 42, 41, 20 and 40 can be connected to conducting films 6a, 7a, 8a, 36a, 37a and 38a in an electrically favorable manner.

Furthermore, even a thin natural oxide film does not receive an etching damage or the like, and hence it is possible to prevent nickel silicide films 40, 41 and 42 from having high resistance caused by the etching damage. In addition to this, it is also possible to reduce resistance of impurity regions 3a, 4a, 33a and 33b, each of which functions as a source or a drain. Furthermore, nickel silicide films 20 and 40 are favorably connected to contact portions 8 and 38, and hence a desired voltage can be applied to gate electrodes 5 and 45.

As shown in FIG. 1, conducting films 6b, 7b, 8b, 36b, 37b and 38b are deposited on conducting films 6a, 7a, 8a, 36a, 37a and 38a to form contact portions 6, 7, 8, 36, 37 and 38, so that semiconductor device 100 is manufactured.

Figure 21:
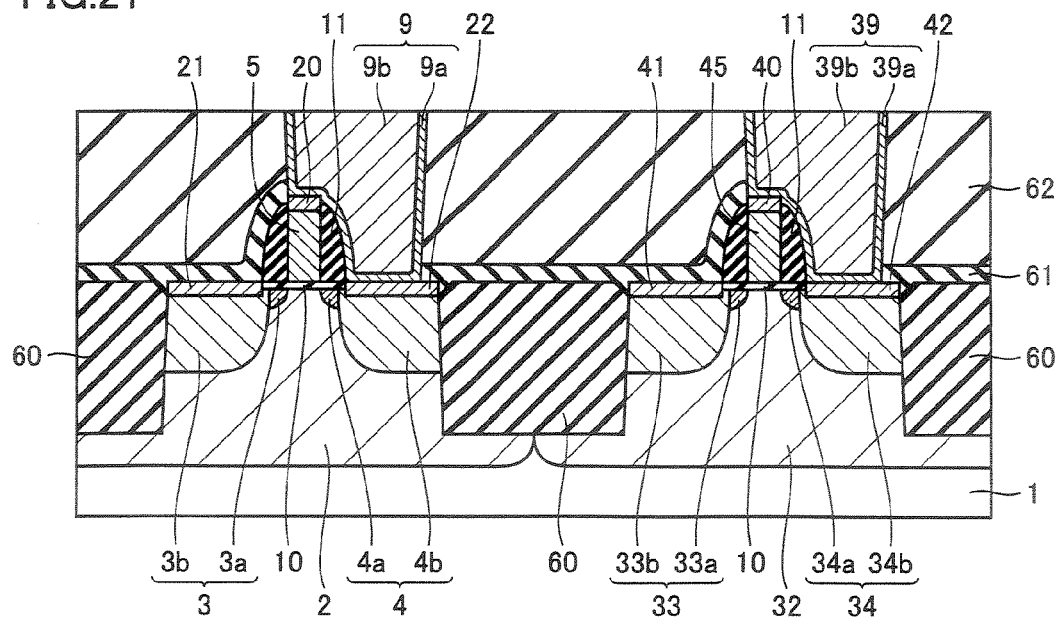
FIG. 21 is a cross section showing a modification of the semiconductor device according to the first embodiment.

FIG. 21 is a cross section showing a modification of semiconductor device 100 according to the first embodiment. As shown in FIG. 21, nickel silicide film 22 and nickel silicide film 20 may be connected via a shared contact portion 9, while nickel silicide film 40 and nickel silicide film 42 may be connected via a shared contact portion 39.

In such semiconductor device 100, the step of removing the natural oxide films formed on the top surfaces of nickel silicide films 22, 21, 42, 41, 20 and 40, and the step of forming conducting films 6a, 7a, 8a, 36a, 37a and 38a, are performed in-situ as described above, to connect nickel silicide films 22, 21, 42, 41, 20 and 40 to conducting films 6a, 7a, 8a, 36a, 37a and 38a in a favorable manner.

Second Embodiment

A semiconductor device according to a second embodiment will hereinafter be described with reference to FIGS. 22 to 30. There may be a case where a configuration identical to or corresponding to that shown in FIGS. 1 to 21 described above, is denoted by the same reference character and the description thereof is not repeated.

Figure 22:
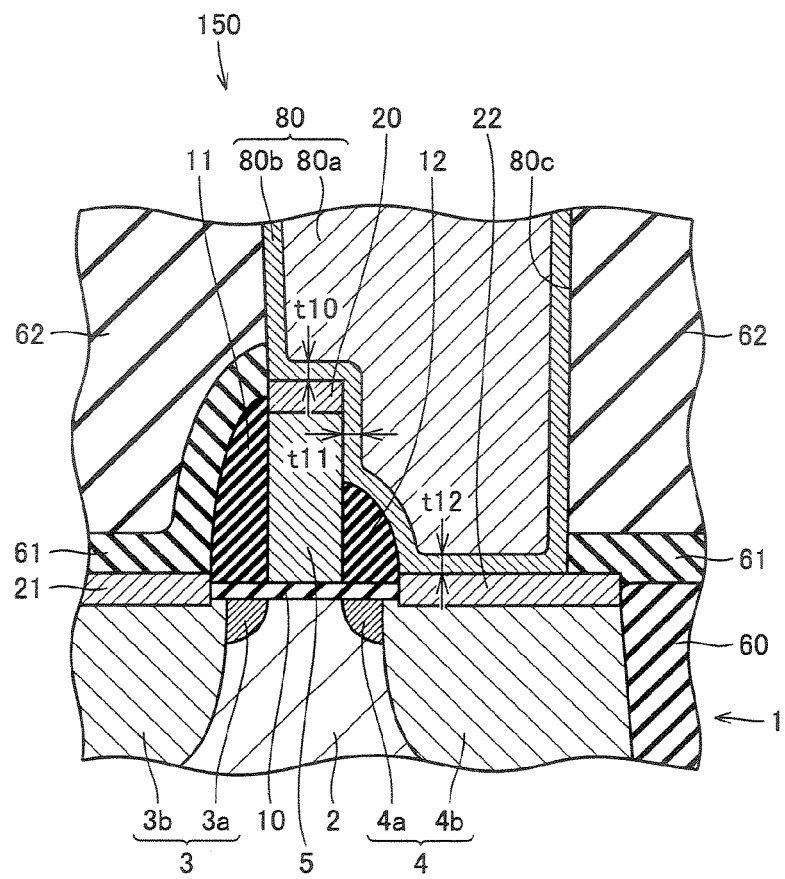
FIG. 22 is a cross section of a portion of the semiconductor device according to a second embodiment, where an nMOS transistor is located.

FIG. 22 is a cross section of an nMOS transistor 150 in the semiconductor device according to the second embodiment. As shown in FIG. 22, p-well region 2 is formed in semiconductor substrate 1, and nMOS transistor 150 is formed at a portion of the main surface of semiconductor substrate 1 where well region 2 is located.

The nMOS transistor 150 is formed on the portion of the main surface of semiconductor substrate 1 where p-well region 2 is located, and includes insulating film 10 formed of a silicon oxide film, for example, gate electrode 5 formed on insulating film 10, and impurity regions 3 and 4 formed on portions of the main surface of semiconductor substrate 1 which are adjacent to gate electrode 5. Nickel silicide (NiSi) films 21 and 22 are formed on the top surfaces of impurity regions 3 and 4, and nickel silicide film 20 is also formed on the top surface of gate electrode 5.

At one side surface of gate electrode 5, there is formed sidewall 11 extending from a top surface side to a bottom surface side of gate electrode 5 and formed of, for example, a silicon oxide film. At the other side surface of gate electrode 5, there is formed a sidewall 12 extending from a middle portion to the bottom surface side of gate electrode 5 and formed of a silicon oxide film.

The nMOS transistor 150 further includes a shared contact 80 connecting gate electrode 5 and impurity region 4 and connected to upper-layer wiring not shown.

Shared contact 80 includes a contact hole 80c formed in interlayer insulating film 62, a conducting film 80b formed at an inner surface of contact hole 80c, and conducting film 80a formed on conducting film 80b.

Contact hole 80c extends from nickel silicide film 20 formed at the top surface of gate electrode 5 to nickel silicide film 22 formed on the top surface of impurity region 4, through a side surface of gate electrode 5 exposed from sidewall 12 and an upper side of sidewall 12.

Conducting film 80b also extends from nickel silicide film 20 through the side surface of gate electrode 5 exposed from sidewall 12 and the upper side of sidewall 12 to cover nickel silicide film 22, and is connected to the upper-layer wiring.

Figure 23:
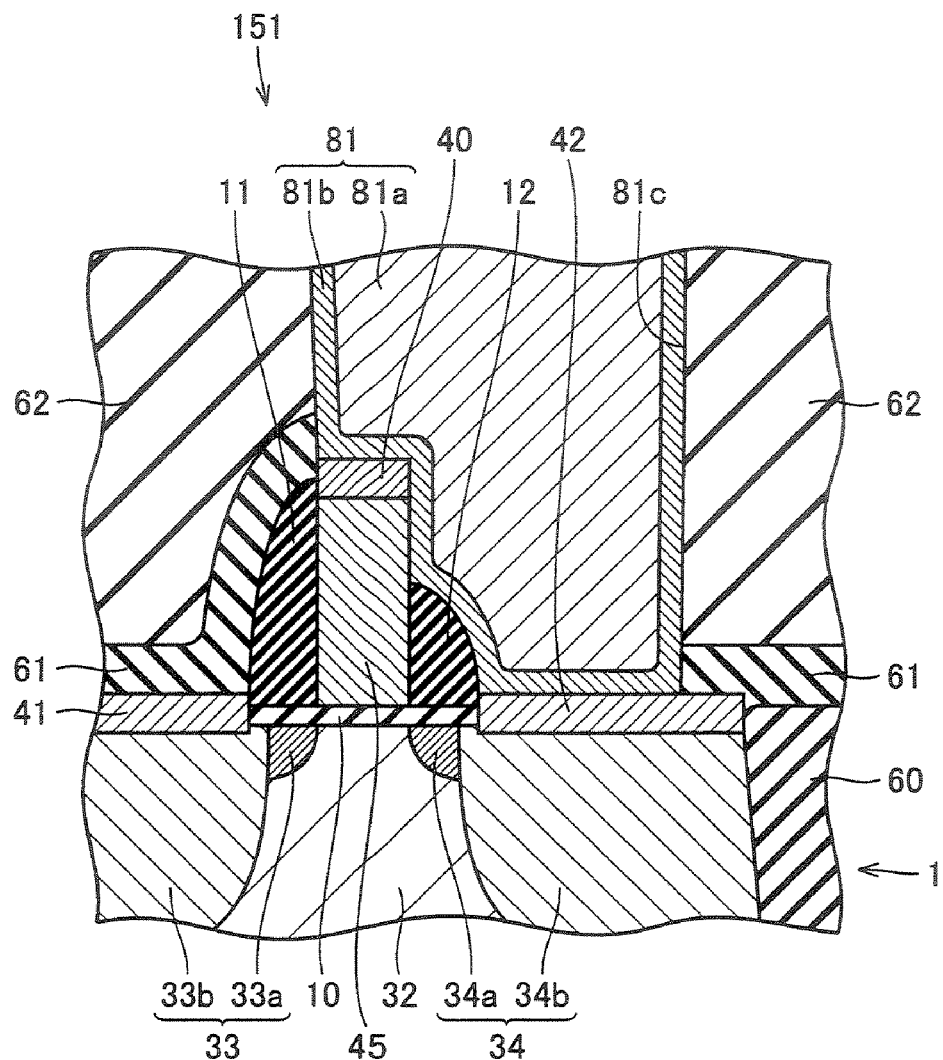
FIG. 23 is a cross section of a portion of the semiconductor device according to the second embodiment, where a pMOS transistor is located.

FIG. 23 is a cross section of a pMOS transistor 151 in the semiconductor device according to the second embodiment. As shown in FIG. 23, pMOS transistor 151 is also configured in a manner similar to that of the above-described nMOS transistor 150. The pMOS transistor 151 includes gate electrode 45 formed on the main surface of semiconductor substrate 1 with insulating film 10 formed on n-well region 32 interposed therebetween, and impurity regions 33 and 34 formed at the portions of the main surface of semiconductor substrate 1 which are adjacent to gate electrode 45. Nickel silicide film 40 is formed at an upper end surface of gate electrode 45, and nickel silicide films 41 and 42 are formed on the top surfaces of impurity regions 33 and 34. Sidewall 11 is formed at one side surface of gate electrode 45, while sidewall 12 is formed at the other side surface of gate electrode 45, sidewall 12 having a height smaller than that of sidewall 11.

Furthermore, pMOS transistor 151 includes a shared contact 81 connecting nickel silicide film 40 formed on the upper end surface of gate electrode 45, nickel silicide film 42 formed at impurity region 34, and the upper-layer wiring not shown.

Shared contact 81 includes a contact hole 81c formed to extend from the top surface of nickel silicide film 40 to at least a part of the top surface of nickel silicide film 42, a conducting film 81b formed at an inner surface of contact hole 81c, and a conducting film 81a formed on a top surface of conducting film 81b.

Figure 24:
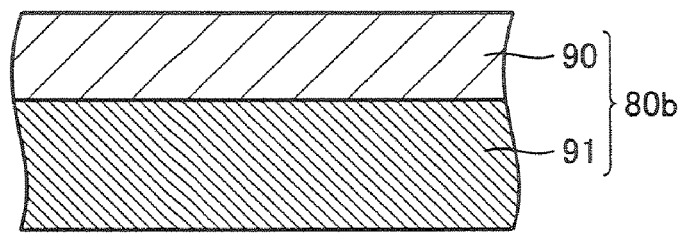
FIG. 24 is cross section showing in detail a conducting film that forms a barrier metal.

FIG. 24 is a cross section showing a detail of conducting film 80b. In FIG. 24, conducting film 80b includes a conducting film 91 formed of any of titanium (Ti), titanium silicide (e.g. TiSi, TiSi$_2$ or the like), tantalum (Ta), tantalum silicide, tungsten (W) and tungsten silicide, and a conducting film 90 formed of at least any of a Ti-based compound including TiN, a Ta-based compound including TaN, and a W-based compound including WN. As shown in FIG. 24, conducting film 80b is not limited to the case where it is formed as a stacked-layer body made of conducting films, and may be formed of a single layer of conducting film 91. Conducting film 81 shown in FIG. 23 is also formed in a manner similar to that of the above-described conducting film 80. In FIG. 22, there are suppressed variations in thickness of conducting film 80b in a direction perpendicular to the surface of conducting film 80b, and a difference in thickness between the thickest portion and the thinnest portion thereof is set to be at most 10 nm, and preferably set to be approximately 5 nm, Specifically, a difference between any two of a thickness t10 of conducting film 80b at the top surface of nickel silicide film 20 (thickness in a direction perpendicular to the surface of conducting film 80b), a thickness t11 of conducting film 80b on the side surface of gate electrode 5 exposed from sidewall 12, and a thickness t12 of conducting film 80b on nickel silicide film 22, is set to be 5 nm-10 nm.

On a top surface of conducting film 80b formed as such, there is formed conducting film 80a formed of W, Al, Cu or the like. Conducting film 81a shown in FIG. 23 is also formed of W, Al, Cu or the like.

As such, impurity region 4, gate electrode 20, and the upper-layer wiring are connected by shared contact 80 having conducting film 80b with an approximately uniform thickness, and hence a desired voltage can be applied properly to impurity region 4 and gate electrode 20.

With the use of shared contact 81 shown in FIG. 23, a desired voltage can also be applied properly to impurity region 44 and gate electrode 45.

Figure 25:
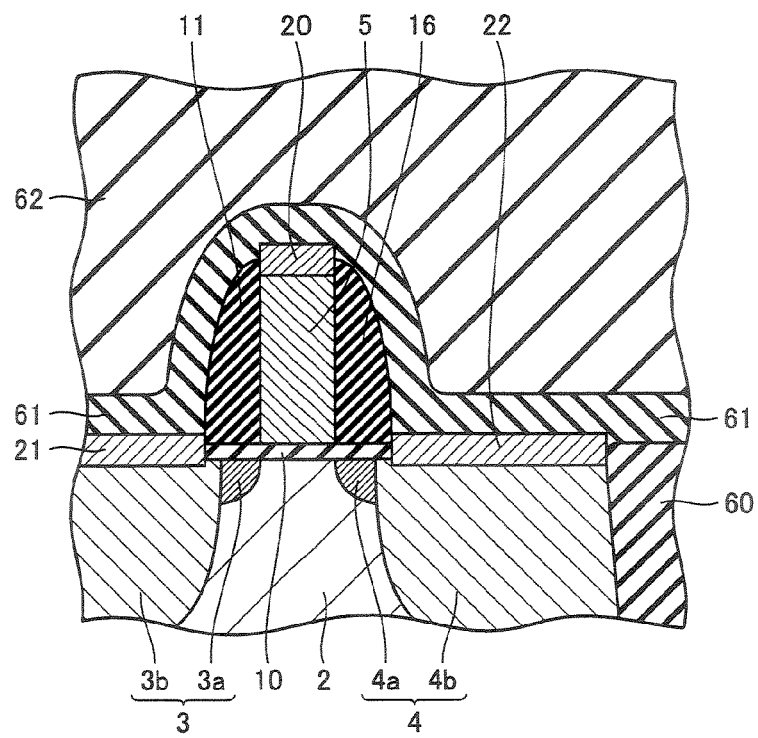
FIG. 25 is a cross section showing a step of manufacturing the semiconductor device according to the second embodiment, after a step corresponding to the tenth step for the semiconductor device according to the first embodiment.
Figure 26:
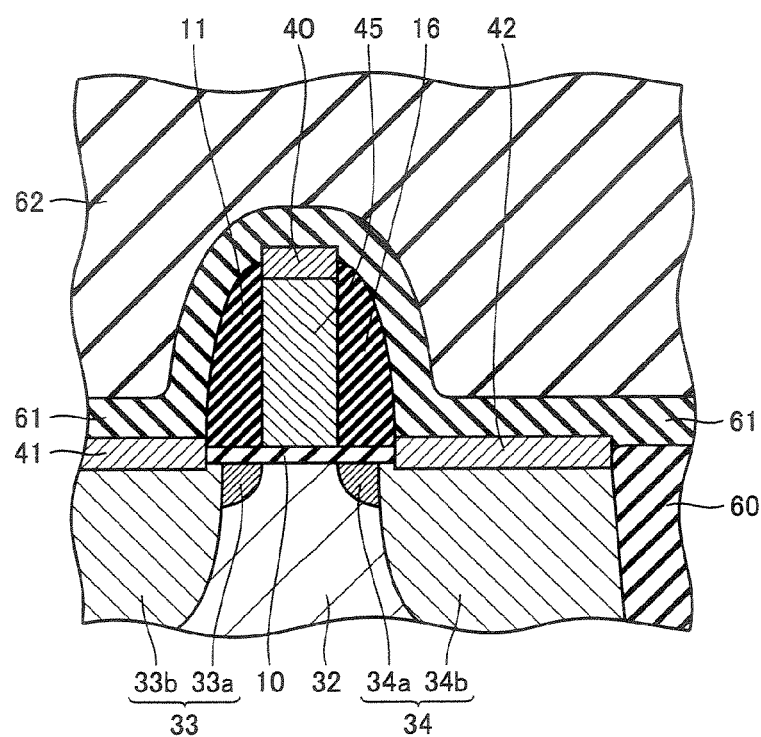
FIG. 26 is a cross section of the portion where the pMOS transistor is located, in the manufacturing step shown in FIG. 25.

A method of manufacturing a semiconductor device according to the present embodiment will hereinafter be described with reference to FIGS. 25 to 30. FIG. 25 is a cross section showing a step after the tenth step of manufacturing the semiconductor device according to the above-described first embodiment shown in FIG. 15, and is a cross section of a portion where nMOS transistor 150 is located. FIG. 26 is a cross section also showing the same step as in FIG. 25, and is a cross section of a portion where pMOS transistor 151 is located.

In the manufacturing step shown in FIG. 25, there exist insulating film 10 formed on the portion of the main surface of semiconductor substrate 1 where p-well region 2 is located, gate electrode 5 formed on insulating film 10, and impurity regions 3 and 4 formed at the portions of the main surface of semiconductor substrate 1 which are adjacent to gate electrode 5. Sidewall 11 is formed on one side surface of gate electrode 5, while a sidewall 16 is formed on the other side surface of gate electrode 5, sidewall 16 having a height identical to that of sidewall 11. Nickel silicide film 20 is formed on the top surface of gate electrode 5, and nickel silicide films 21 and 22 are formed on the top surfaces of impurity regions 3 and 4.

Furthermore, insulating film 61 and insulating film 62 are successively stacked to cover these nickel silicide films 21, 22 and 20, and sidewalls 11 and 16.

As shown in FIG. 26, in the portion where pMOS transistor 151 is formed, there also exist insulating film 10 formed on the portion of the main surface of semiconductor substrate 1 where n-well region 32 is located, gate electrode 45 formed on insulating film 10, and impurity regions 33 and 34 formed on the portions of the main surface of semiconductor substrate 1 which are adjacent to gate electrode 45.

Nickel silicide film 40 is formed at the upper end surface of gate electrode 45, and sidewalls 11 and 16 are formed on both side surfaces of gate electrode 45. Nickel silicide films 41 and 42 are formed at the top surfaces of impurity regions 33 and 34. Insulating films 61 and 62 are formed to cover nickel silicide films 40, 41 and 42, and sidewalls 11 and 16.

Figure 27:
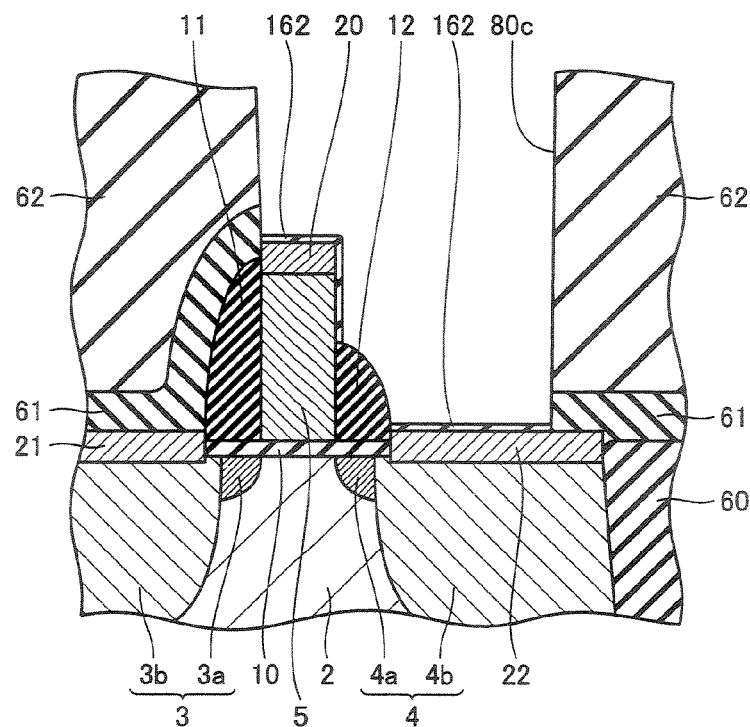
FIG. 27 is a cross section showing a step of manufacturing the semiconductor device according to the second embodiment, after the manufacturing step shown in FIG. 25.
Figure 28:
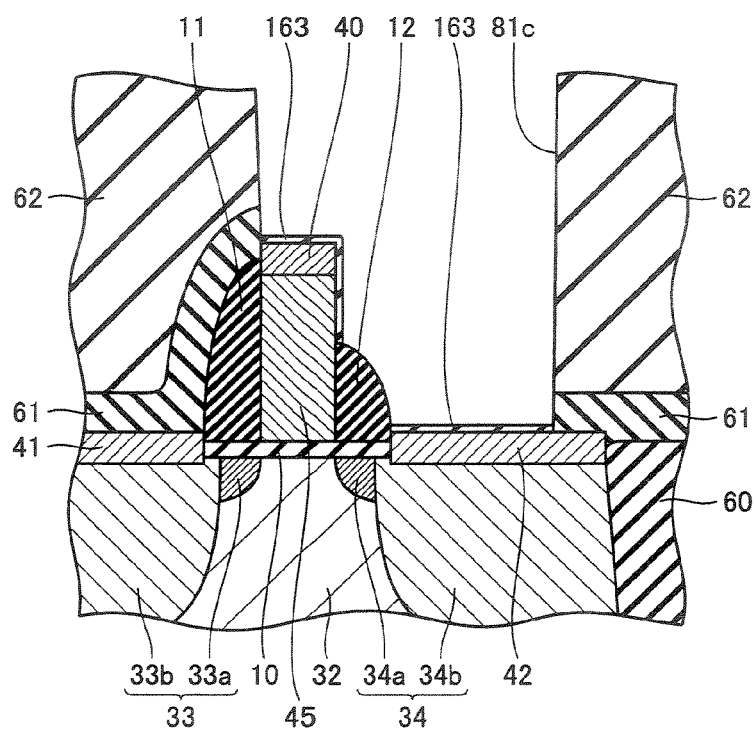
FIG. 28 is a cross section showing a step of manufacturing the semiconductor device according to the second embodiment, after the manufacturing step shown in FIG. 26.

FIG. 27 is a cross section showing a manufacturing step after the step of manufacturing the semiconductor device shown in FIG. 25 above, and is a cross section of a portion where nMOS transistor 150 is located. FIG. 28 is a cross section showing a manufacturing step after the manufacturing step shown in FIG. 26 above, and is a cross section of a portion where pMOS transistor 151 is located.

As shown in FIGS. 27 and 28, insulating films 61 and 62 are patterned to form contact holes 80c and 81c.

By doing so, a height of sidewall 16 formed on the side surface of each of gate electrodes 5 and 45 is reduced, and at least a part of the side surface of each of gate electrodes 5 and 45 is exposed outwardly. Accordingly, regions are exposed outwardly from nickel silicide films 20 and 40 formed at the upper end surfaces of gate electrodes 5 and 45 to at least a part of the top surfaces of nickel silicide films 22 and 42 formed on the top surfaces of impurity regions 4 and 34, through the exposed side surfaces of gate electrodes 5 and 45 and the top surfaces of sidewalls 12.

After such contact holes 80c and 81c are formed, semiconductor substrate 1 is transported to another chamber to form conducting films 80b and 81b shown in FIGS. 22 and 23. During the process of transportation, outwardly-exposed nickel silicide films 20, 22, 40 and 42, and the outwardly-exposed side surfaces of gate electrodes 5 and 45 may be oxidized so that a thin natural oxide films may be formed thereon.

Semiconductor substrate 1 is then transported to the chamber for forming conducting films 80b and 81b. In the chamber, prior to the step of forming conducting films 80b and 81b, the natural oxide film formed at each of nickel silicide films 20, 22, 40 and 42, and gate electrodes 5 and 45 are removed.

Specifically, there is supplied to the chamber, for example, any of a mixed gas of an $NF_3$ gas and an $NH_3$ gas, a mixed gas of the $NF_3$ gas and an HF gas, a mixed gas of the $NF_3$ gas and an $H_2$ gas, a mixed gas of the $NH_3$ gas and the $H_2$ gas, and a mixed gas of the $NH_3$ gas and the HF gas. In other words, for the mixed gas to be supplied, there is used any of a mixed gas of the $NF_3$ gas and a gas containing a hydrogen element, and a mixed gas of the $NH_3$ gas and the gas containing the hydrogen element. The natural oxide film is generally formed of a silicon oxide film, and when the natural oxide film reacts with any of the mixed gas of the $NF_3$ gas and the $NH_3$ gas, the mixed gas of the $NF_3$ gas and the HF gas, the mixed gas of the $NF_3$ gas and the $H_2$ gas, the mixed gas of the $NH_3$ gas and the $H_2$ gas, and the mixed gas of the $NH_3$ gas and the BF gas, it turns into $NH_4F$ or $(NH_4)_2SiF_6$, and $H_2O$.

Accordingly, on nickel silicide films 20, 22, 40 and 42, and the exposed side surfaces of gate electrodes 5 and 45, there are formed thin films (protective films) 162 and 163 made of $NH_4F$ or $(NH_4)_2SiF_5$.

After such thin films 162 and 163 are formed, they are annealed at a temperature of at least 100° C. and at most 300° C. to remove the same, so that nickel silicide films 20, 22, 40 and 42, and the side surfaces of gate electrodes 5 and 45 are exposed.

As such, it is possible to remove the natural oxide film and a residue of the silicon oxide film, which residue is left when contact holes 80c and 81c are formed.

The natural oxide films formed on the surfaces of nickel silicide films 20 and 22 have larger thicknesses than the natural oxide films formed at nickel silicide films 40 and 42. Furthermore, the natural oxide film formed on the side surface of gate electrode 5 has a larger thickness than the natural oxide film formed on the side surface of gate electrode 45.

Accordingly, the natural oxide films formed on the surfaces of nickel silicide films 40 and 42, and the natural oxide film formed on the side surface of gate electrode 45 are initially removed, so that the surfaces and the side surface are exposed outwardly. Subsequently, the natural oxide films formed at nickel silicide films 20 and 22 and gate electrode 5 are removed, so that nickel silicide films 20 and 22 and the side surface of gate electrode 5 are exposed outwardly.

Only a weak reaction occurs between the mixed gas described above, and the nickel silicide film or the polycrystalline silicon where impurities such as phosphorus (P), arsenic (As), boron (B) or the like are introduced, and hence the mixed gas exerts little influence on them. Accordingly, there is suppressed an adverse effect such as etching of the side surface of gate electrode 45 and nickel silicide films 40 and 42.

Figure 29:
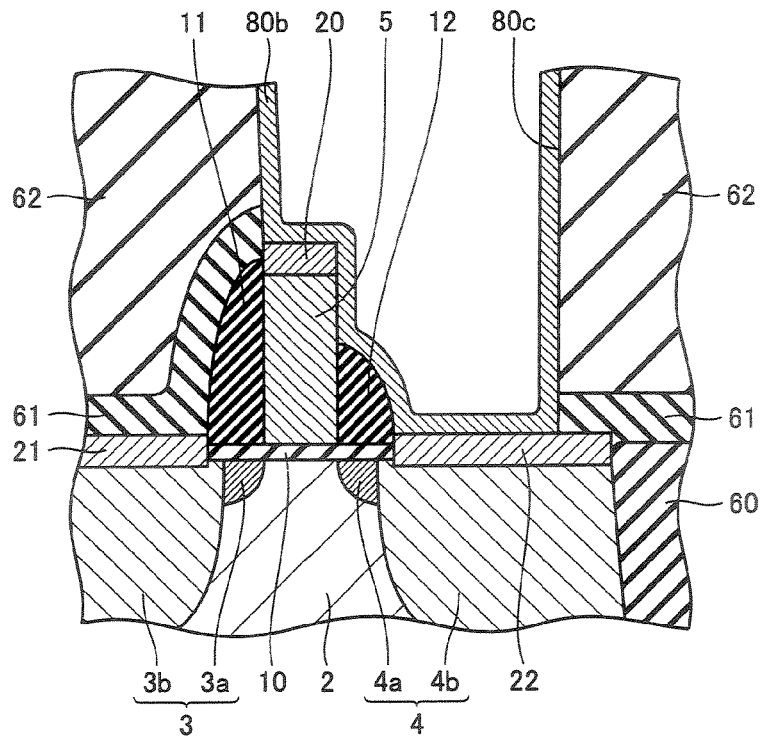
FIG. 29 is a cross section showing a step of manufacturing the semiconductor device according to the second embodiment, after the manufacturing step shown in FIG. 27.
Figure 30:
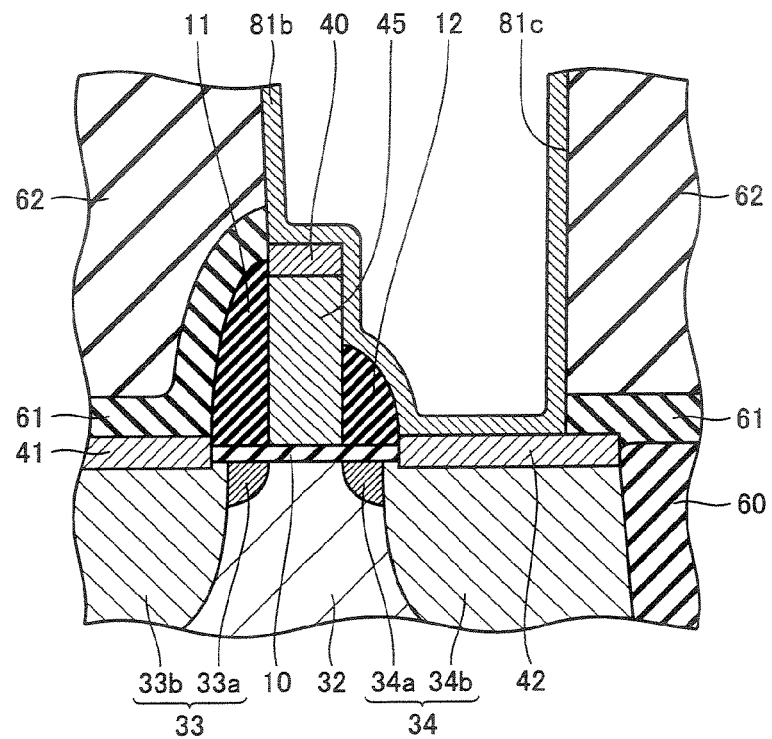
FIG. 30 is a cross section showing a step of manufacturing the semiconductor device according to the second embodiment, after the manufacturing step shown in FIG. 28.

FIGS. 29 and 30 are cross sections showing manufacturing steps after the manufacturing steps shown in FIGS. 27 and 28 above. As shown in FIGS. 29 and 30, conducting films 80b and 81b are formed.

Specifically, titanium tetrachloride (TiCi$_4$) is initially used under the condition of a temperature of approximately 400° C.-550° C. to perform film formation by an inorganic CVD method, with which a plasma damage is suppressed, so that there is formed conducting film 91 made of titanium (Ti) as shown in FIG. 24.

When the titanium film is formed with such an inorganic CVD method, a titanium layer having an approximately uniform film thickness can be formed even in a contact hole having a high aspect ratio.

By doing so, it is possible to form conducting film 91 made of a titanium layer shown in FIG. 24, on the top surfaces of nickel silicide films 20, 22, 40 and 42, and at the exposed side surfaces of gate electrodes 5 and 45.

By forming conducting film 91 with a low-temperature, inorganic CVD method, there is suppressed a transition from NiSi, which forms nickel silicide films 20, 22, 40 and 42 located under the conducting film 91 to be formed, to NiSi$_2$, so that there is suppressed an increase in electric resistance of nickel silicide films 20, 22, 40 and 42.

In other words, the temperature at which conducting film 91 is formed is set to be lower than 650° C., which is a transition temperature of nickel silicide (NiSi), so that it is possible to reduce resistance of nickel silicide films 20, 22, 40 and 42, which function as wiring.

Furthermore, when conducting film 91 is to be formed, there is no foreign substance such as a natural oxide film on the top surfaces of nickel silicide films 21, 22, 41 and 42, and the side surfaces of gate electrodes 5 and 45, the top surfaces and the side surfaces being exposed owing to contact holes 80c and 81c. Accordingly, nickel silicide films 21, 22, 41 and 42 can be connected to conducting films 80b and 81b via conducting film 91 in a reliably electrical manner.

Here, conducting film 91 made of titanium may react with Si in semiconductor substrate 1 and conducting film 91 may turn into titanium silicide. As such, even if conducting film 91 is formed of titanium or titanium silicide, its electric resistance remains low, and hence a desired voltage can be applied to gate electrode 5 and impurity diffused layer 4. Furthermore, unlike the CVD method in a plasma atmosphere, this method exerts little influence on insulating film 10, so that insulating film 10 functioning as a gate insulating film can be protected.

The surface of conducting film 91 is subjected to heat treatment at a temperature of at most 550° C. in an ammonia gas atmosphere to form conducting film 90 formed of titanium nitride (TiN) as shown in FIG. 24, to form conducting film 80b. Conducting film 81b is also formed concurrently with conducting film 80b.

Conducting films 80a and 81a shown in FIGS. 22 and 23 are formed next. Specifically, a WF$_6$/H$_2$-based gas is used to form conducting films 80a and 81a formed of tungsten. At this time, conducting film 90 formed of tungsten nitride (TiN) is formed to cover the surface of conducting film 91 made of titanium (Ti) or the like in FIG. 24, so that it is possible to suppress a reaction between WF$_6$ and Ti (2WF$_6$+3Ti 2W+3TiF$_4$) and hence deterioration, exfoliation or the like of tungsten films 21, 22, 41 and 42 can be suppressed. Furthermore, it is also possible to suppress diffusion of fluorine (F) into semiconductor substrate 1, which fluorine is produced when a tungsten film is formed.

Additionally, conducting film 91 is also formed at a portion of gate electrodes 5 and 45 exposed from sidewall 12, and hence when tungsten is formed, diffusion of fluorine (F) into gate electrodes 5 and 45 can be prevented.

As such, after shared contacts 80 and 81 are formed, conducting films 80a, 80b, 81a and 81b and insulating film 62 are planarized. There is then formed the upper-layer wiring to be connected to shared contacts 80 and 81. As such, the semiconductor device according to the second embodiment can be manufactured.

With the method of manufacturing the semiconductor device according to the present invention, it is possible to favorably remove a natural oxide film formed at a main surface of the semiconductor substrate and on a metal film, for example, by suppressing overetching or the like of the semiconductor substrate and the metal film located under the natural oxide film. In the semiconductor device according to the present invention, the natural oxide film is approximately removed, which makes it possible to provide the metal film formed on the main surface of the semiconductor substrate, for example, with an approximately uniform thickness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

introducing first impurities of a first conductivity type into a main surface of a semiconductor substrate to form a first impurity region;

introducing second impurities of a second conductivity type into the main surface of said semiconductor substrate to form a second impurity region, the second conductivity type being different from the first conductivity type;

forming a first nickel silicide film on said first impurity region and forming a second nickel silicide film on said second impurity region;

forming an insulating film on each of said first and second nickel silicide films;

forming an interlayer insulating film on said insulating film;

forming contact holes over each of the first and second nickel silicide films to etch the insulating film and the interlayer insulating film;

removing an oxide film formed under said contact holes and formed on each of said first and second nickel silicide films by using a mixed gas having an NF$_3$ gas and a gas containing a hydrogen element mixed therein; and forming a first conducting film on said first nickel silicide film and forming a second conducting film on said second nickel silicide film, with said oxide film removed.

2. The method of manufacturing the semiconductor device according to claim 1, wherein the step of removing said oxide film and the step of forming said first conducting film and forming said second conducting film are performed in the same processing room.

3. The method of manufacturing the semiconductor device according to claim 1, further comprising the steps of transporting said semiconductor substrate to a second processing room after said oxide film is removed in a first processing room, by allowing a protective film capable of suppressing oxidation of a surface of each of said first nickel silicide film and said second nickel silicide film to be left on each of said first nickel silicide film and said second nickel silicide film, the second processing room being different from the first processing room, removing said protective film in said second processing room after said semiconductor substrate is transported thereto, and forming said first conducting film and said second conducting film after said protective film is removed.

4. The method of manufacturing the semiconductor device according to claim 1, wherein said gas containing the hydrogen element is any of $NH_3$, HF, and $H_2$.

5. The method of manufacturing the semiconductor device according to claim 1, wherein said oxide film formed on each of said first nickel silicide film and said second nickel silicide film is removed in a plasma atmosphere.

6. The method of manufacturing the semiconductor device according to claim 1, further comprising the step of using any of a mixed gas containing an $NF_3$ gas and an HF gas, a mixed gas containing the $NF_3$ gas and an $H_2$ gas, and a mixed gas containing the $NF_3$ gas and an $NH_3$ gas, to form a first oxidation-resistant film on said first impurity region and form a second oxidation-resistant film on said second impurity region, wherein
said first and second nickel silicide films are formed after said first and second oxidation-resistant films are removed.

7. A method of manufacturing a semiconductor device, comprising the steps of:
introducing first impurities of a first conductivity type into a first semiconductor layer formed on a main surface of a semiconductor substrate to form a first gate electrode;
introducing second impurities of a second conductivity type into a second semiconductor layer formed on the main surface of said semiconductor substrate to form a second gate electrode, the second conductivity type being different from said first conductivity type;
forming a first nickel silicide film on said first gate electrode and forming a second nickel silicide film on said second gate electrode;
forming an insulating film on each of said first and second nickel silicide films;
forming an interlayer insulating film on said insulating film; forming contact holes over each of the first and second nickel silicide films to etch the insulating film and the interlayer insulating film;
using a mixed gas having an $NH_3$ gas and a gas containing a hydrogen element mixed therein to remove an oxide film formed under said contact holes and formed on each of said first and second nickel silicide films; and
forming a first conducting film on said first nickel silicide film and forming a second conducting film on said second nickel silicide film, with said oxide film removed.

8. A method of manufacturing a semiconductor device, comprising the steps of:
forming a semiconductor layer at a main surface of a semiconductor substrate;
forming an impurity region by introducing impurities into the main surface of said semiconductor substrate, said impurity region being adjacent to said semiconductor layer, and forming a gate electrode by introducing said impurities into said semiconductor layer;
forming a first insulating film on each of both side surfaces of said gate electrode;
forming a first nickel silicide film on said impurity region and forming a second nickel silicide film on said gate electrode;
forming a second insulating film covering said gate electrode and said impurity region;
forming an interlayer insulating film on said second insulating film;
etching said second insulating film and said interlayer insulating film to to form a contact hole-extending from an upper side of said first nickel silicide film to an upper side of said second nickel silicide film;
using any of a mixed gas having an $NF_3$ gas and a gas containing a hydrogen element mixed therein and a mixed gas having an $NH_3$ gas and the gas containing the hydrogen element to remove an oxide film formed under said contact hole and formed on each of said first and second nickel silicide films; and
forming a conducting film extending from said first nickel silicide film to said second nickel silicide film.

9. A method of manufacturing a semiconductor device, comprising the steps of:
forming a first semiconductor layer and a second semiconductor layer at a first portion and a second portion, respectively, of a main surface of a semiconductor substrate;
introducing first impurities of a first conductivity type into a third portion of the main surface of said semiconductor substrate to form a first impurity region, the third portion being adjacent to said first semiconductor layer;
introducing said first impurities into said first semiconductor layer to form a first gate electrode;
introducing second impurities of a second conductivity type into a fourth portion of the main surface of said semiconductor substrate to form a second impurity region, the fourth portion being adjacent to said second semiconductor layer, and the second conductivity type being different from said first conductivity type;
introducing said second impurities into said second semiconductor layer to form a second gate electrode;
forming a first insulating film on each of both side surfaces of said first gate electrode and forming a second insulating film on each of both side surfaces of said second gate electrode;
forming a first nickel silicide film on said first impurity region and forming a second nickel silicide film on said second impurity region;
forming a third nickel silicide film on said first gate electrode and forming a fourth nickel silicide film on said second gate electrode;
forming a third insulating film covering said first and second gate electrodes and said first and second impurity regions;
etching said third insulating film to expose a region extending from an upper side of said first nickel silicide film to an upper side of said third nickel silicide film and expose a region extending from an upper side of said second nickel silicide film to an upper side of said fourth nickel silicide film;
using any of a mixed gas having an $NF_3$ gas and a gas containing a hydrogen element mixed therein and a mixed gas having an $NH_3$ gas and the gas containing the hydrogen element mixed therein to remove an oxide film formed at each of said first, second, third, and fourth nickel silicide films;
forming a first conducting film extending from the upper side of said first nickel silicide film to the upper side of said third nickel silicide film; and
forming a second conducting film extending from the upper side of said second nickel silicide film to the upper side of said fourth nickel silicide film.

10. The method of manufacturing the semiconductor device according to claim 9, wherein said first and second conducting films are formed at a temperature lower than a transition temperature of said first, second, third, and fourth nickel silicide films.

11. The method of manufacturing the semiconductor device according to claim 9, further comprising the step of nitriding a surface of each of said first and second conducting films.

* * * * *